United States Patent
Hosokawa et al.

(10) Patent No.: US 8,340,617 B2
(45) Date of Patent: Dec. 25, 2012

(54) SAMPLING MIXER, QUADRATURE DEMODULATOR, AND WIRELESS DEVICE

(75) Inventors: Yoshifumi Hosokawa, Osaka (JP); Yoshito Shimizu, Osaka (JP); Tadashi Morita, Kanagawa (JP); Atsushi Maruyama, Kanagawa (JP)

(73) Assignee: Panasonic Corporation, Osaka (JP)

( * ) Notice: Subject to any disclaimer, the term of this patent is extended or adjusted under 35 U.S.C. 154(b) by 245 days.

(21) Appl. No.: 12/745,240

(22) PCT Filed: Dec. 10, 2008

(86) PCT No.: PCT/JP2008/003696
§ 371 (c)(1),
(2), (4) Date: May 27, 2010

(87) PCT Pub. No.: WO2009/075105
PCT Pub. Date: Jun. 18, 2009

(65) Prior Publication Data
US 2010/0311375 A1    Dec. 9, 2010

(30) Foreign Application Priority Data
Dec. 12, 2007    (JP) .................................. 2007-320380

(51) Int. Cl.
*H04B 1/26* (2006.01)
(52) U.S. Cl. ...................................... 455/313; 455/265
(58) Field of Classification Search .......... 455/313–334, 455/255–265
See application file for complete search history.

(56) References Cited

U.S. PATENT DOCUMENTS

| | | | | |
|---|---|---|---|---|
| 4,816,898 A * | 3/1989 | Farley et al. | .................. | 455/296 |
| 5,521,946 A * | 5/1996 | Main | ............................. | 375/350 |
| 6,989,869 B2 * | 1/2006 | Cooper et al. | ................ | 455/307 |
| 7,817,746 B2 * | 10/2010 | Hori et al. | ...................... | 375/296 |
| 2003/0050027 A1 * | 3/2003 | Muhammad et al. | ......... | 455/257 |
| 2003/0083033 A1 * | 5/2003 | Staszewski et al. | ........... | 455/323 |
| 2005/0036572 A1 * | 2/2005 | Muhammad et al. | ......... | 375/322 |
| 2006/0071707 A1 * | 4/2006 | Belveze et al. | ............... | 327/554 |
| 2009/0196384 A1 * | 8/2009 | Staszewski et al. | ........... | 455/313 |
| 2009/0270061 A1 | 10/2009 | Hosokawa | | |
| 2010/0109746 A1 | 5/2010 | Hosokawa | | |
| 2011/0199122 A1 * | 8/2011 | Morishita et al. | ............. | 327/291 |

FOREIGN PATENT DOCUMENTS

| | | |
|---|---|---|
| EP | 1 411 639 | 4/2004 |
| JP | 2004-289793 | 10/2004 |
| JP | 2006-211153 | 8/2006 |
| WO | 2007/061000 | 5/2007 |
| WO | 2007/148693 | 12/2007 |
| WO | 2008/129791 | 10/2008 |

OTHER PUBLICATIONS

International Search Report dated Feb. 10, 2009.

* cited by examiner

*Primary Examiner* — Lana N Le
(74) *Attorney, Agent, or Firm* — Dickinson Wright PLLC

(57) ABSTRACT

There are provided a sampling mixer, quadrature demodulator, and a wireless device capable of suppressing receiving sensitivity degradation caused by alias components or second-order distortion components. In the sampling mixer (101), a sampling switch (5) and another sampling switch (36) sample a reception signal based on a local signal with a predetermined frequency. A control signal generator (15) generates a control signal for controlling a filter operation. An in-phase mixer (2) and a reverse-phase mixer (3) perform, based on the control signal, filter processing on the sample signal obtained by the sampling switch (5). A delay controller (117) controls the phase difference between the local signal and the control signal according to a reception-desired frequency.

14 Claims, 15 Drawing Sheets

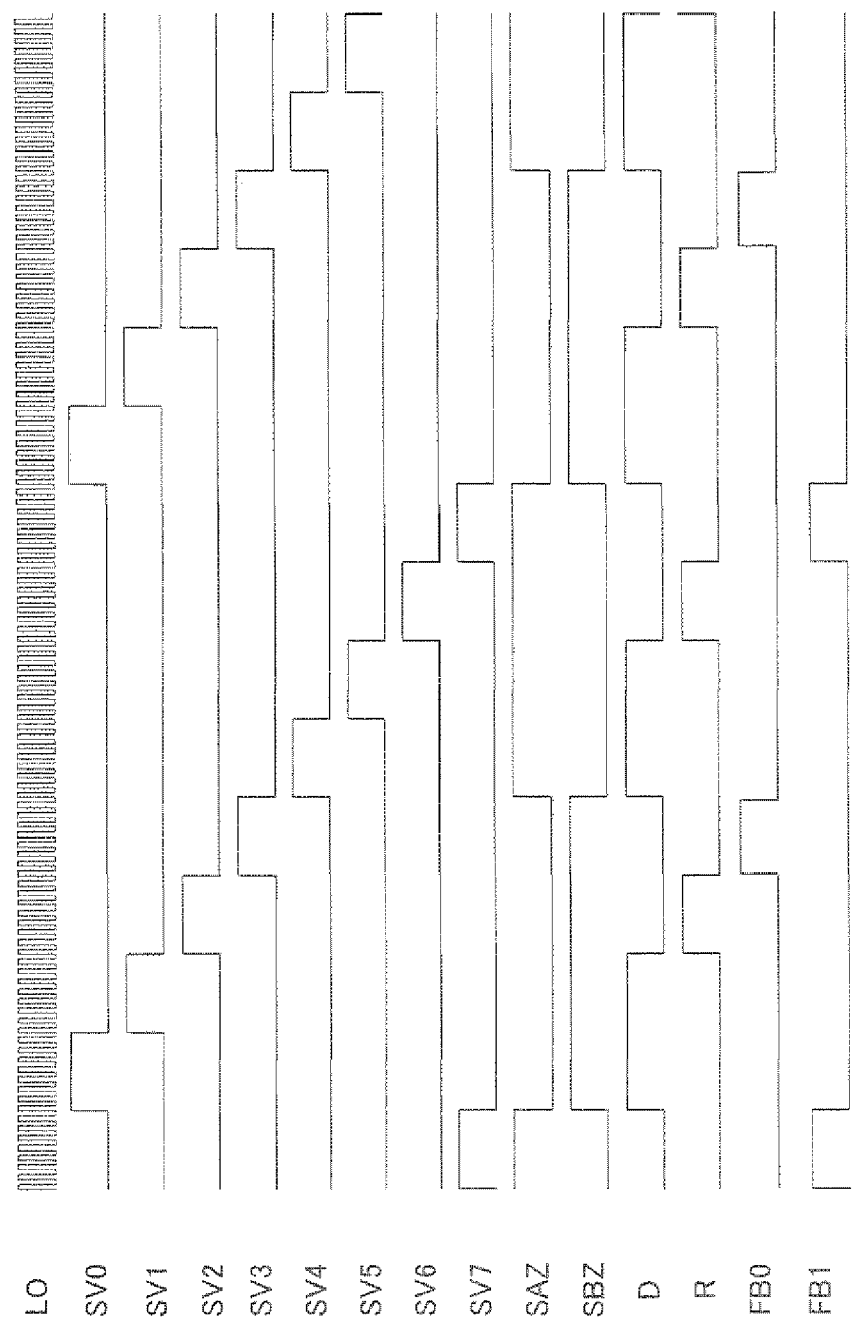

US 8,340,617 B2

SAMPLING MIXER, QUADRATURE DEMODULATOR, AND WIRELESS DEVICE

TECHNICAL FIELD

The present invention relates to a sampling mixer, quadrature demodulator and radio apparatus that perform digital signal processing such as filtering.

BACKGROUND ART

A wireless communication apparatus uses a sampling mixer, which temporally discretizes a signal and performs frequency conversion and filtering. With a conventional sampling mixer, signals subjected to digital modulation are sampled in a sampling circuit, and a filtering effect is provided by a switched capacitor incorporated in a sampling circuit (e.g. see Patent Document 1 and Patent Document 2).

FIG. 1 is a circuit diagram of sampling mixer 600 disclosed in Patent Document 1 and Patent Document 2.

In FIG. 1, sampling mixer 600 is provided with: TA (Transconductance Amplifier) 1 that converts received radio frequency ("RF") signals into RF current $i_{RF}$; in-phase mixer section 2 that performs frequency conversion of RF current $i_{RF}$ converted in TA 1 by sampling; reverse-phase mixer section 3 combined with in-phase mixer section 2; and DCU (Digital Control Unit) 4 that generates control signals for in-phase mixer section 2 and quadrature-phase mixer section 3.

In-phase mixer section 2 contains sampling switch 5 and Ch (which stands for "history capacitor") 6 that temporally continuously integrates signals sampled in this sampling switch 5. Further, in-phase mixer section 2 contains a plurality of Cr's (which stand for "rotating capacitors") 7 to 14 that repeat integrating and releasing signals sampled in sampling switch 5, and Cb (which stands for "buffer capacitor") 15 that temporarily stores signals released from Cr's 7 to 14.

Further, in-phase mixer section 2 contains dump switch 16 that releases signals stored in Cr's 7 to 14 to Cb 15, reset switch 17 that resets signals stored in Cr's 7 to 14 after the release, and a plurality of integration switches 18 to 25 that connect Ch 6 with Cr's 7 to 14 in order. Further, in-phase mixer section 2 contains a plurality of release switches 26 to 33 that connect Cb 15 with Cr's 7 to 14 in order, and feedback switches 34 and 35 that control inputs of feedback signals from a DA (Digital-to-Analog) converter to the side of sampling mixer 600. Here, reverse-phase mixer section 3 employs a circuit configuration similar to that of in-phase mixer section 2, except for performing sampling half the period behind in-phase mixer section 2.

In in-phase mixer section 2 of sampling mixer 600 employing the above configuration, RP currents $i_{RF}$ of different timings are accumulated in Cr's 7 to 14, and the accumulated electrical charges are released alternately from the group of Cr's 7 to 10 and the group of Cr's 11 to 14. Thus, by periodically releasing electrical charges accumulated in Cr's 7 to 14, discrete time sample streams are created.

However, alias components occur in the filter characteristics of sampling mixer 600, at frequency intervals matching the operation frequencies of the groups provided in parallel and at frequency intervals matching the overall output frequency of Cr's 7 to 14, which is equivalent to the sum of both operation frequencies. When these alias components occur in the reception band after frequency conversion, a problem arises that the reception sensitivity degrades. Therefore, there is a demand to suppress alias components.

As effective measures to take against alias components in a conventional sampling mixer, there is a method of using, for example, a bandpass filter and removing interference signals that are present in frequencies corresponding to alias components before the sampling mixer receives signals as input.

Also, in an environment where there are desired received signals and interference signals, second-order distortion components occur due to the non-linearity of switches forming sampling mixer 600. If signal transmission characteristics match between in-phase mixer section 2 and reverse-phase mixer section 3, it is possible to cancel second-order distortion components by differential combination in a subsequent circuit of sampling mixer 600. However, if signal transmission characteristics mismatch between in-phase mixer section 2 and reverse-phase mixer section 3, it is not possible to suppress second-order distortion components upon differential combination. As a result, second-order distortion components remain in a received signal band after frequency conversion, which causes the degradation of reception sensitivity. Therefore, there is also a demand to suppress second-order distortion components.

To suppress second-order distortion components in a conventional sampling mixer, the positive-phase circuit and negative-phase circuit in a differential circuit configuration are designed to be symmetrical.

Patent Document 1: Japanese Patent Application Laid-Open Number 2004-289793 (pages 6 to 9, FIG. 3, FIG. 3b and FIG. 4)

Patent Document 2: U.S. Patent Application Publication Number 2003/0083033, specification, "SAMPLING MIXER WITH ASYNCHRONOUS CLOCK AND SIGNAL DOMAINS"

DISCLOSURE OF INVENTION

Problems to be Solved by the Invention

However, there is the following problem with the above method of suppressing alias components using a bandpass filter. A steep filter to remove interference signals has a large circuit scale and has difficulty in realizing the filter characteristic. Therefore, actually, interference signals that cannot be removed completely by the filter remain and a sampling mixer receives these interference signals as input, which causes a problem that it is not possible to effectively suppress alias components due to the operation frequencies of parallel configuration parts (i.e. a group of Cr's 7 to 10 and a group of Cr's 11 to 14). Further, upon forming a quadrature demodulator, if an in-phase sampling mixer and a quadrature sampling mixer with a local ("LO") signal phase 90-degrees different from the in-phase sampling mixer, are driven by the same control signal, the overall reception sensitivity of the quadrature demodulator degrades due to the occurrence of alias components that cannot be suppressed by one of the sampling mixers.

Also, even if the positive-phase circuit and negative-phase circuit in a differential circuit configuration are designed to be symmetrical, it is still difficult to completely eliminate the mismatch of elements between the positive-phase circuit and the negative-phase circuit and cancel second-order distortion components. Therefore, a problem also arises that it is not possible to effectively suppress second-order distortion components due to the mismatch of elements. Further, similar to alias components, upon forming a quadrature demodulator, if an in-phase sampling mixer and a quadrature sampling mixer are driven by the same control signal, the overall reception sensitivity of the quadrature demodulator degrades due to the occurrence of second-order distortion components that cannot be suppressed by one of the sampling mixers.

It is therefore an object of the present invention to provide a sampling mixer, quadrature demodulator and radio apparatus for suppressing the degradation of reception sensitivity due to alias components or second-order distortion components.

Means for Solving the Problem

The sampling mixer of the present invention employs a configuration having: a sampling switch that samples a received signal based on a local signal of a predetermined frequency; a control signal generating section that generates a control signal for controlling a filter operation; a switched capacitor section that performs filter processing of a sample signal acquired in the sampling switch, based on the control signal; and a phase difference control section that controls a phase difference between the local signal and the control signal according to a frequency of a desired reception signal.

The quadrature demodulator of the present invention that includes an in-phase sampling mixer, a quadrature-phase sampling mixer and a local signal generating section, where the in-phase sampling mixer and the quadrature-phase sampling mixer employ a configuration having: a sampling switch that samples a received signal based on a local signal of a predetermined frequency; a control signal generating section that generates a control signal for controlling a filter operation; a switched capacitor section that performs filter processing of a sample signal acquired in the sampling switch, based on the control signal; and a phase difference control section that controls a phase difference between the local signal and the control signal according to a frequency of a desired reception signal.

The radio apparatus of the present invention includes the above sampling mixer and a signal processing section that performs signal processing based on an output signal of the sampling mixer.

Advantageous Effect of the Invention

According to the present invention, it is possible to provide a sampling mixer, quadrature demodulator and radio apparatus for suppressing the degradation of reception sensitivity due to alias components or second-order distortion components.

BRIEF DESCRIPTION OF DRAWINGS

FIG. 7 shows a timing chart of control signals generated in a control signal generating section;

BEST MODE FOR CARRYING OUT THE INVENTION

Figure 1:
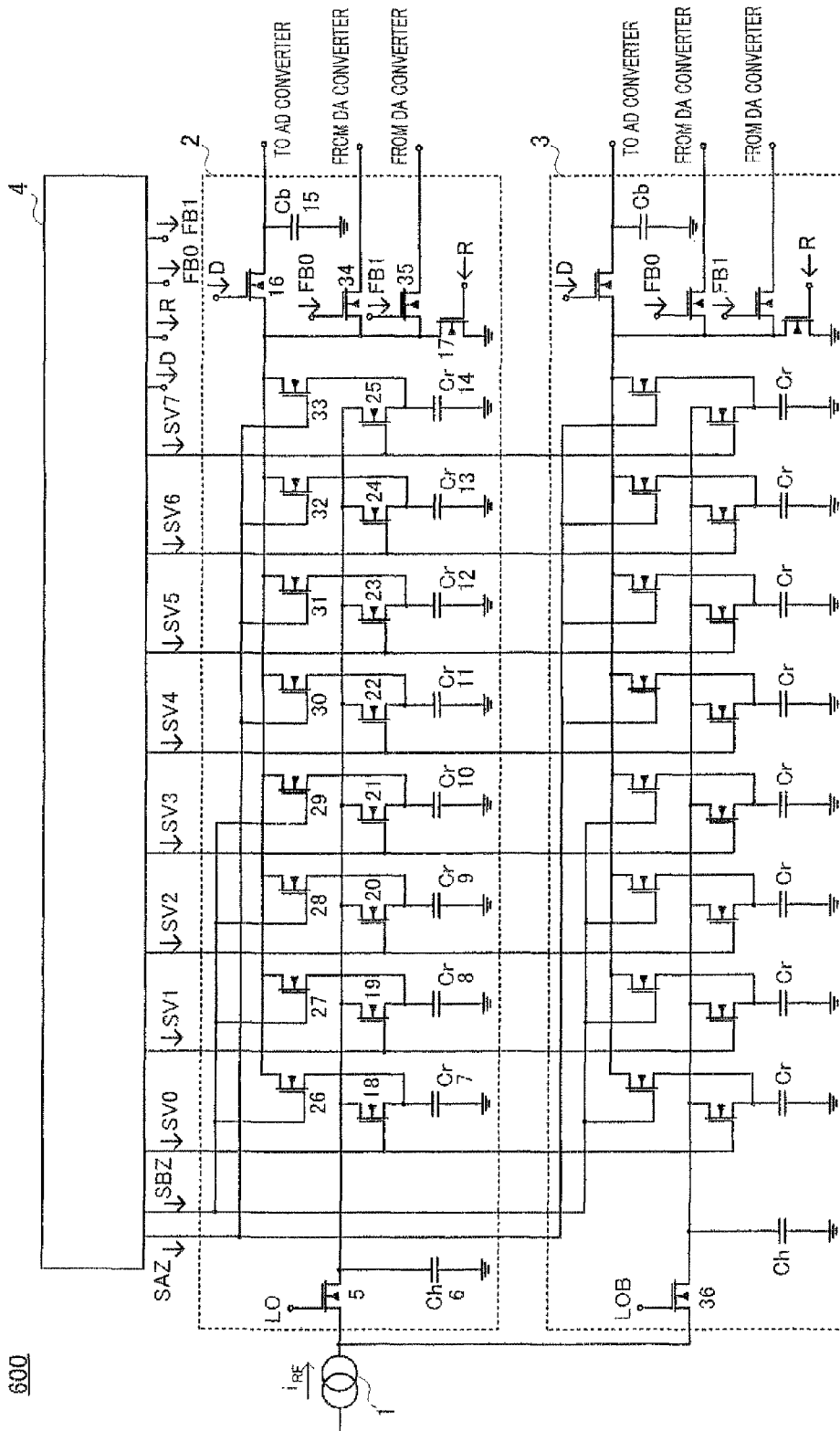
FIG. 1 is a circuit diagram showing a sampling mixer of a prior art.

Embodiments of the present invention will be explained below in detail with reference to the accompanying drawings. Here, in the embodiments, the same components will be assigned the same reference numerals and their explanation will be omitted.

(Embodiment 1)

Figure 2:
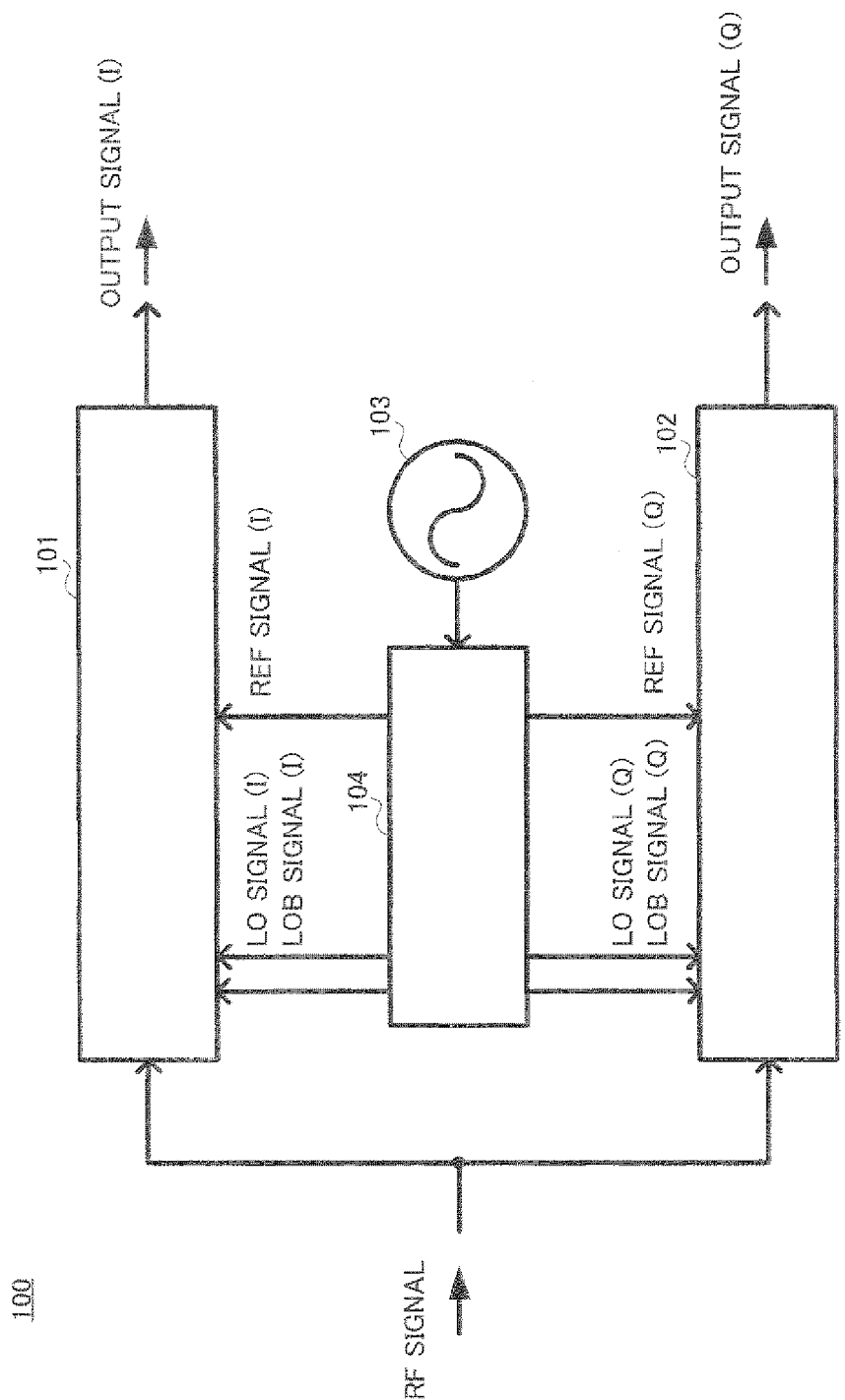
FIG. 2 is a block diagram showing the configuration of a quadrature demodulator according to Embodiment 1 of the present invention.

FIG. 2 is a block diagram showing the configuration of quadrature demodulator 100 according to Embodiment 1 of the present invention. In FIG. 2, quadrature demodulator 100 is provided with in-phase sampling mixer 101, quadrature-phase sampling mixer 102, local oscillator 103 and LOS signal generating section 104.

Local oscillator 103 outputs a signal of predetermined frequency to LO signal generating section 104. Local oscillator 103 outputs, for example, signals of twice the frequency of an LO signal, to LO signal generating section 104.

LO signal generating section 104 divides the frequency of signals received from local oscillator 103, and outputs the resulting LO signals, LOB signals and REF signals with adjusted output timings, to in-phase sampling mixer 101 and quadrature-phase sampling mixer 102. LO signal generating section 104 changes the phases of LO signal (Q), LOB signal (Q) and REF signal (Q), which are outputted to quadrature-phase sampling mixer 102, by 90 degrees from the phases of LO signal (I), LOB signal (I) and REF signal (I), which are outputted to in-phase sampling mixer 101. Further, LO signal generating section 104 outputs the resulting signals with adjusted output timings, to quadrature-phase sampling mixer 102. Here, for example, the LO signals and LOB signals are signals dividing the frequency of signals outputted from local oscillator 103 by 2, and the REF signals are signals dividing the frequency of signals outputted from local oscillator 103 by 4.

Figure 3:
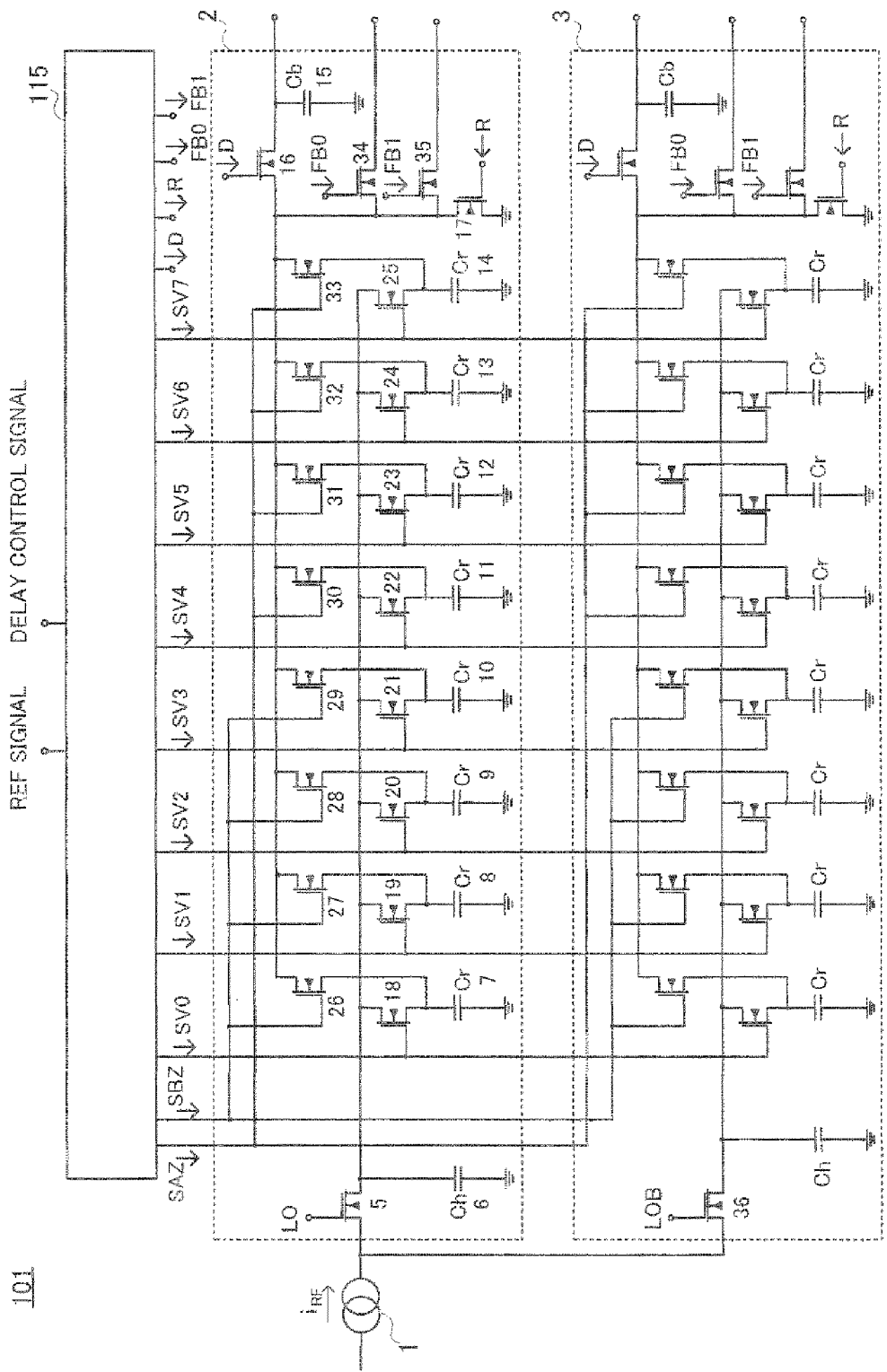
FIG. 3 shows a circuit configuration of an in-phase sampling mixer.

FIG. 3 shows a circuit configuration of in-phase sampling mixer 101. Also, quadrature-phase sampling mixer 102 has the same circuit configuration as in-phase sampling mixer 101, and therefore its explanation will be omitted. Here, the phases of input LO signals and REF signals vary between in-phase sampling mixer 101 and quadrature-phase sampling mixer 102.

In FIG. 3, in-phase sampling mixer 101 is provided with: TA (Transconductance Amplifier) 1 that converts received radio frequency ("RF") signals into RF current $i_{RF}$; in-phase mixer section 2 that performs frequency conversion of RF current $i_{RF}$ converted in TA 1 by sampling; reverse-phase mixer section 3 combined with in-phase mixer section 2; and control signal generating section 115 that generates control signals for in-phase mixer section 2 and reverse-phase mixer section 3.

In-phase mixer section 2 contains sampling switch 5 and Ch (which stands for "history capacitor") 6 that temporally continuously integrates signals sampled in this sampling switch 5. Further, in-phase mixer section 2 contains a plurality of Cr's (which stand for "rotating capacitors") 7 to 14 that repeat integrating and releasing signals sampled in sampling switch 5, and Cb (which stands for "buffer capacitor") 15 that temporarily stores signals released from Cr's 7 to 14.

Further, in-phase mixer section 2 contains dump switch 16 that releases signals stored in Cr's 7 to 14 to Cb 15, reset switch 17 that resets signals stored in Cr's 7 to 14 after the release, and a plurality of integration switches 18 to 25 that connect Ch 6 with Cr's 7 to 14 in order. Further, in-phase mixer section 2 contains a plurality of release switches 26 to 33 that connect Cb 15 with Cr's 7 to 14 in order, and feedback switches 34 and 35 that control inputs of feedback signals from a DA (Digital-to-Analog) converter to the side of in-phase sampling mixer 101.

In FIG. 3, a combination of a rotating capacitor, integration switch and release switch, which are arranged in tandem, forms one unit. For example, Cr 7, integration switch 18 and release switch 26 form one unit.

Reverse-phase mixer section 3 has a similar configuration to in-phase mixer section 2. Here, an LOB that is received as input in sampling switch 36 is delayed by half the period behind an LO that is received as input in sampling switch 5. Therefore, there is a difference of half the period between the sampling timing in in-phase mixer section 2 and the sampling timing in reverse-phase mixer section 3.

Control signal generating section 115 generates various control signals based on an REF signal received from LO signal generating section 104, and outputs the generated various control signals. Further, control signal generating section 115 adjusts the output timings of these various control signals based on the first delay control signal received from a signal processing section (not shown).

Control signal generating section 115 is connected with the gates of integration switches 18 to 25, release switches 26 to 33, dump switch 16, reset switch 17 and feedback switches 34 and 35. Further, control signal generating section 115 outputs various control signals to these gates of switches 16 to 34.

Control signals generated in control signal generating section 115 include SV0 to SV7 signals, SAZ signal, SBZ signal, D signal, R signal and F signals (i.e. FB 0 and FB 1). The SV0 to SV7 signals are the gate signals of integration switches 18 to 25, respectively. The SAZ signal is the gate signal of release switches 30 to 33, and the SBZ signal is the gate signal of release switches 26 to 29. The D signal is the gate signal of dump switch 16, and the R signal is the gate signal of reset switch 17. The FB 0 is the gate signal of feedback switch 34, and the FB 1 signal is the gate signal of feedback switch 35.

Figure 4:
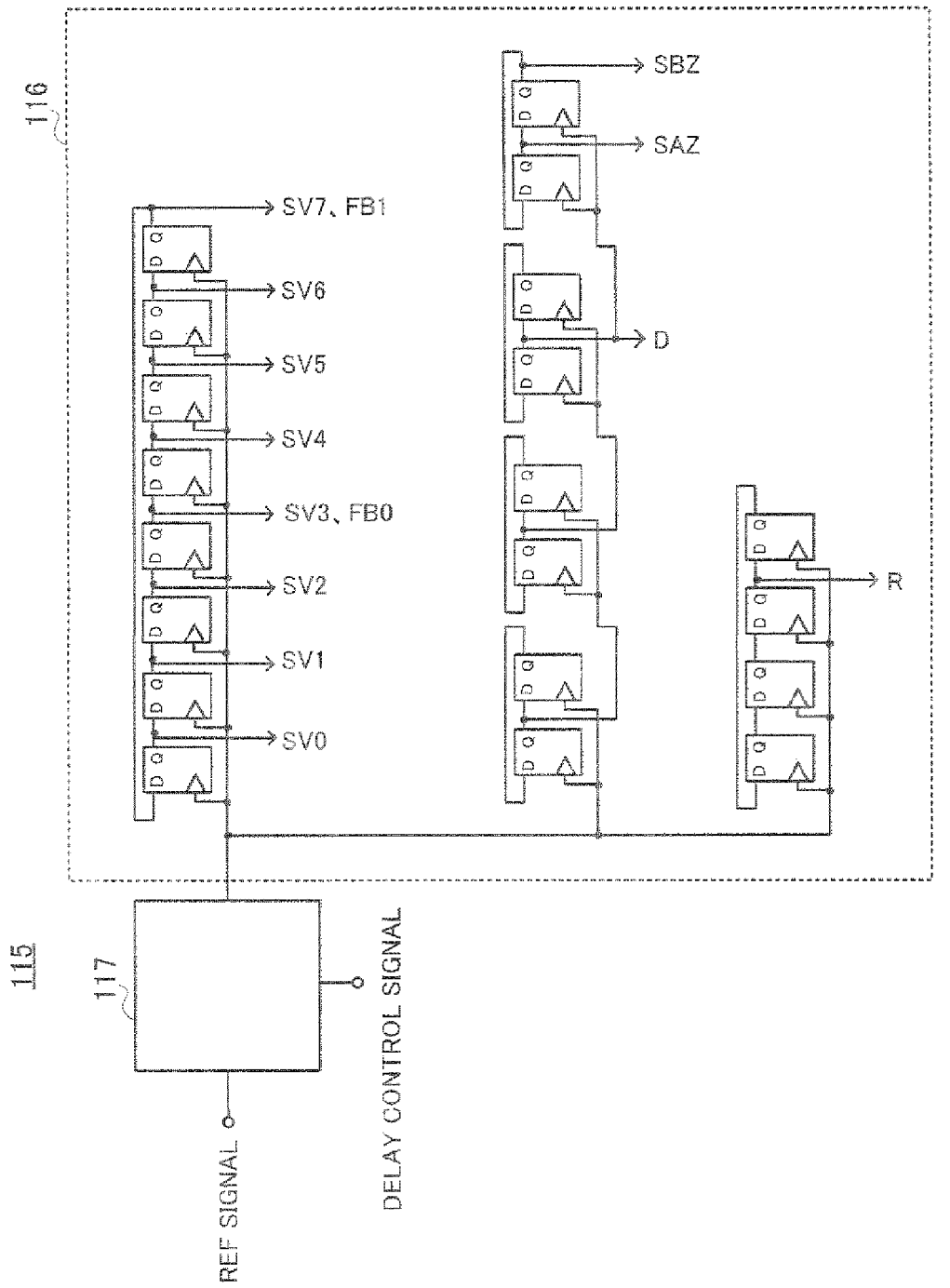
FIG. 4 is a block diagram showing the configuration of a control signal generating section.

FIG. 4 is a block diagram showing the configuration of control signal generating section 115. In FIG. 4, control signal generating section 115 is provided with control signal generating circuit 116 formed with D flip-flops, which are general circuits, and delay control section 117.

Delay control section 117 gives a delay based on a delay time control signal to an input delay REF signal, and outputs the result to control signal generating circuit 116.

Control signal generating circuit 116 generates various control signals based on the signal received from delay control section 117. Further, control signal generating circuit 116 generates control signals in shift registers and frequency division circuits.

Thus, in control signal generating circuit 116, fixed processing is applied to input signals. Therefore, control signal generating section 115 adjusts the phase of an output control signal by adjusting the amount of delay to give to input signals in delay control section 117.

FIG. 5 shows a specific configuration example of delay control section 117.

Figure 5B:
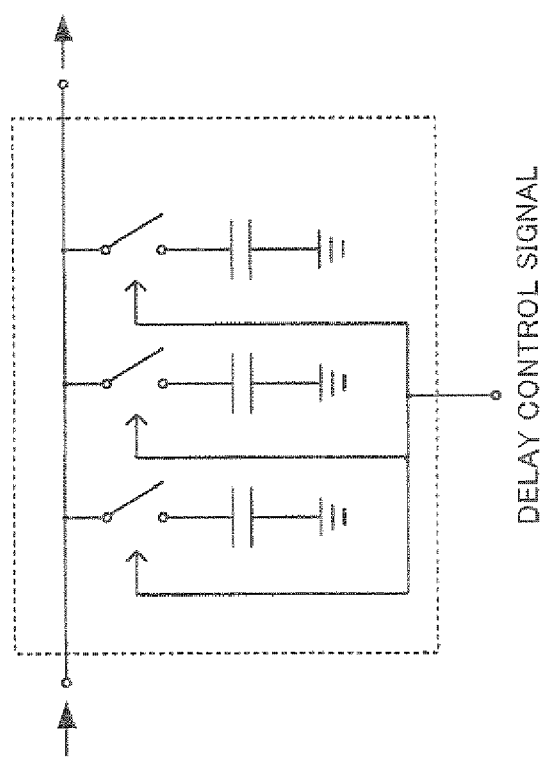
FIG. 5 shows a specific configuration example of a delay control section.
Figure 5A:
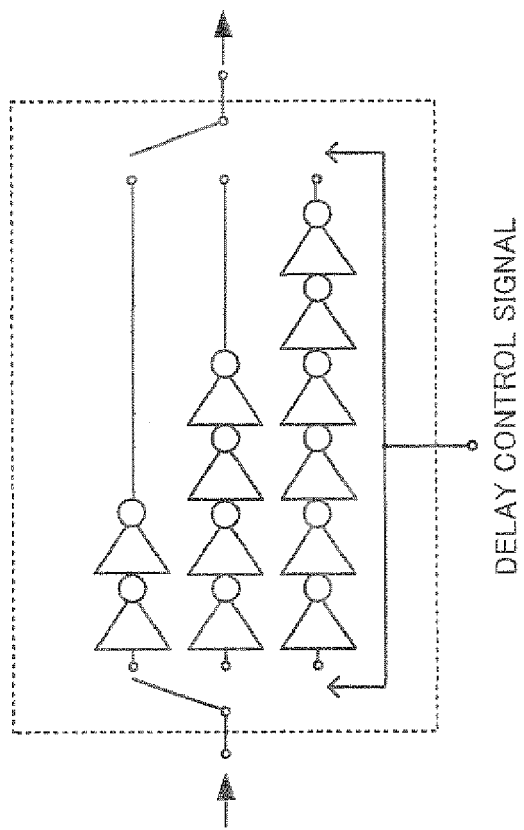

FIG. 5A shows a circuit example of delay control section 117 in the case where delay time is controlled by an inverter. Delay control section 117 shown in FIG. 5A provides a plurality of paths between which the number of inverters to be set varies. Therefore, delay time to be given varies between the paths. Delay control section 117 can adjust the amount of delay to give to input signals by switching a path according to the delay control signal. Although delay control section 117 shown in FIG. 5A employs a configuration in which one path is selected from three paths with two inverters, four inverters and six inverters, this is just an example. That is, paths with other numbers of inverters can be combined, and the number of paths is not limited to three.

Also, FIG. 5B shows a circuit example of delay control section 117 in the case where delay time is controlled by the capacity of capacitors. Delay control section 117 shown in FIG. 5B provides a plurality of capacitors between which the capacity value varies. Delay control section 117 can adjust the amount of delay to give to input signals by switching a capacitor to be connected with the path for input signals according to a delay control signal. When the capacity value of a connected capacitor increases, the delay time given to input signals becomes long. Although delay control section 117 shown in FIG. 5B employs a configuration in which one connected capacitor is selected from three capacitors, the present invention is not limited to this, and it is equally possible to select one connected capacitor from two capacitors, three capacitors or more.

Figure 6:
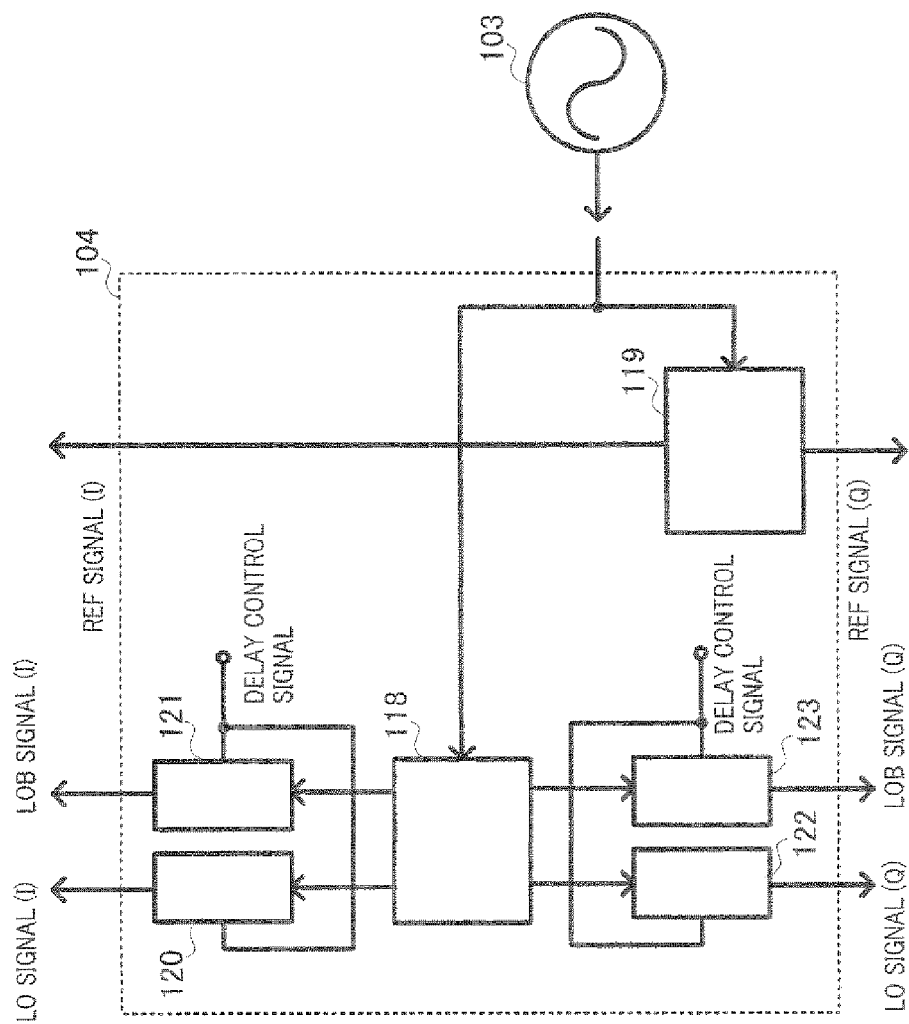
FIG. 6 is a block diagram showing the configuration of an LO signal generating section.
Figure 8B:
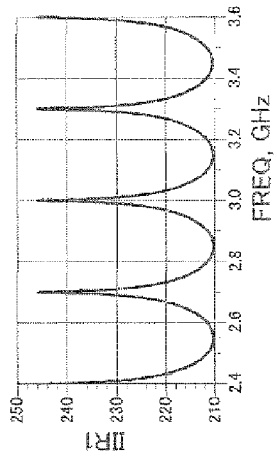
FIG. 8 shows filter characteristics.
Figure 8D:
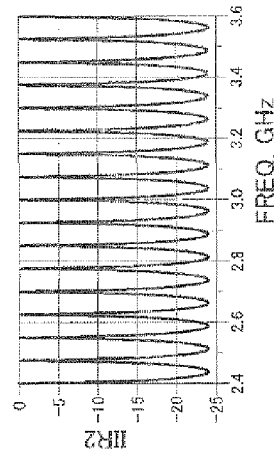
Figure 8A:
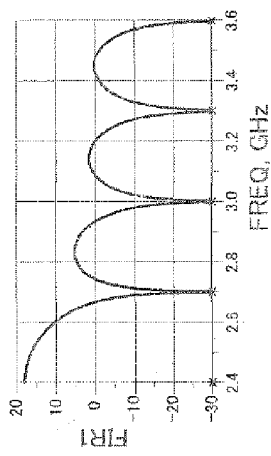
Figure 8C:
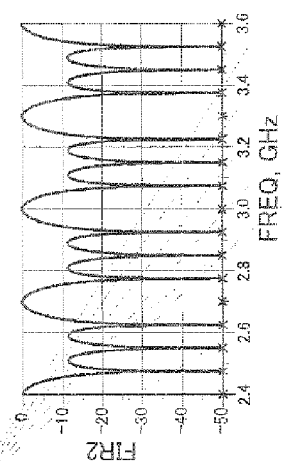
Figure 8E:
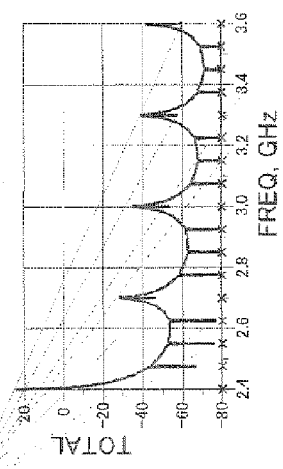

FIG. 6 is a block diagram showing the configuration of LO signal generating section 104.

In FIG. 6, LO signal generating section 104 is provided with: frequency divider 118 that divides the frequency of an output of local oscillator 103 by 2; frequency divider 119 that divides the frequency of the output of local oscillator 103 by 4; delay control sections 120 and 121 that adjust the output timing of an LO signal (I) and LOB signal (I) outputted from frequency divider 118; and delay control sections 122 and 123 that adjust the output timing of an LO signal (Q) and LOB signal (Q) outputted from frequency divider 118.

Frequency dividers 118 and 119 are circuits using, for example, general D flip-flops.

Delay control sections 120 to 123 give a delay based on a delay control signal received from a signal processing section (not shown), to the LO signal (I), the LOB signal (I), the LO signal (Q) and the LOB signal (Q), and then outputs these signals. Thus, by adjusting the output timings of LO signal (I), LOB signal (I), LO signal (Q) and LOB signal (Q) based on delay control signals, the sampling timings of received radio signals are adjusted. Delay control sections 120 to 123 can use the same circuit as in delay control section 117 shown in FIG. 5. Also, delay control sections 120 and 121 receive as input the same second delay control signal. Also, delay control sections 122 and 123 receive as input the same third delay control signal.

A signal processing section (not shown), which outputs delay control signals to delay control section 117 and delay control sections 120 to 123, holds an association table associating combinations of the LO signal frequency, the RF signal frequency and the output signal frequency of quadrature demodulator 100 (i.e. the setting states of quadrature demodulator 100) with "unique phase differences" based on the combinations. Here, as described below, a "unique phase difference" represents the phase difference in which the alias component level is much lower than other phases when the phase difference between an LO signal and control signal was changed.

Further, the signal processing section (not shown) specifies a unique phase difference associated with the setting state of quadrature demodulator 100, using the association table, and outputs delay control signals to delay control section 117 and delay control section 120 such that the phase difference between the LO signal (I) and a control signal outputted from control signal generating section 115 matches the specified unique phase difference. A control signal received in delay control section 120 is also given to delay control section 121. By this means, the phase difference between the LOB signal (I) and a control signal outputted from control signal generating section 115 is also adjusted.

The signal processing section (not shown) outputs delay control signals to delay control section 117 and delay control section 122 such that the phase difference between the LO signal (Q) and a control signal outputted from control signal generating section 115 matches the specified unique phase difference even in quadrature-phase sampling mixer 102. A control signal received in delay control section 122 is also given to delay control section 123. By this means, the phase difference between the LOB signal (Q) and a control signal outputted from control signal generating section 115 is also adjusted in quadrature-phase sampling mixer 102.

The operations of quadrature demodulator 100 having the above configuration will be explained. As described above, in-phase sampling mixer 101 and quadrature-phase sampling mixer 102 have the same configuration and share common characteristics. Therefore, the operations of in-phase sampling mixer 101 will be mainly explained below.

FIG. 7 shows a timing chart of control signals generated in control signal generating section 115. FIG. 7 shows an LO signal received as input in in-phase mixer section 2 of in-phase sampling mixer 101, and various control signals used in in-phase sampling mixer 101. Also, reverse-phase mixer section 3 of in-phase sampling mixer 101 receives as input various control signals and an LOB signal with a phase difference of half the period behind the LO signal. That is, an LOB signal, which operates as a gate signal of sampling switch 35 of reverse-phase mixer section 3, has a phase delay of 180 degrees to an LO signal, and the timing of sampling in reverse-phase mixer section 3 is delayed by half the period behind the timing in in-phase mixer section 2. However, the control signals received as input in reverse-phase mixer section 3 match the control signals received as input in in-phase mixer section 2. Therefore, the operations of reverse-phase mixer section 3 match the operations of reverse-phase mixer section 2, which will be explained below, except that the timing of sampling RF frequency signals varies. Here, upon generating various control signals from REF signals, as described in explanation of control signal generating section 115 with FIG. 3 and FIG. 4, phases are controlled. Therefore, the phase of an LO signal and the phases of various control signals do not match, and the phase difference is controlled.

In in-phase mixer section 2 of in-phase sampling mixer 101, RF current $i_{RF}$ is sampled in switch 5 and converted to discrete signals which are temporally discretized. Based on SV0 to SV7 signals, these discrete signals are integrated in Ch 6 and Cr's 7 to 14 in order, and subjected to filtering and decimation.

By this means, it is possible to provide an effect of an 8-tap FIR (Finite Impulse Response) filter. In this case, the sampling rate in integration switches 18 to 25 is one-eighth of the overall sampling rate of in-phase mixer section 2. This is because signals held in eight Cr's 7 to 14 are subjected to moving-average in eight integration switches 18 to 25. This filter is referred to as "first FIR filter." The transfer function of the first FIR filter is represented by the following equation.

[1]

$$H_{FIR1} = \frac{1-z^{-8}}{1-z^{-1}} \quad \text{(Equation 1)}$$

Also, Ch 6, which is connected with Cr's 7 to 14 in order, holds the output voltage, so that it is possible provide an effect of an IIR (Infinite Impulse Response) filter. This filter is referred to as "first IIR filter." The transfer function of the first IIR filter is represented by the following equation. Here, assume that the capacity of Ch 6 is "Ch" and the capacity of each of Cr's 7 to 14 is "Cr."

[2]

$$H_{IIR1} = \frac{1}{Ch + Cr - Chz^{-1}} \quad \text{(Equation 2)}$$

Further, when release switches 26 to 29 receive as input the above SBZ signal, all release switches 26 to 29 are turned on during the high level of the SBZ signal. Then, discrete signals integrated in Cr's 7 to 10 are simultaneously outputted to Cb 15 via on-state release switches 26 to 29.

By this means, signals integrated in Cr's 7 to 10 are released to Cb 15 at the same time, thereby providing an effect of a 4-tap FIR filter. In this case, the sampling rate in dump switch 16 operated by an SBZ signal is one-fourth of the sampling rate in integration switches 18 to 25. This is because signals integrated in four Cr's 7 to 10 are subjected to moving-average in Cb 15.

Also, signals integrated in Cr's 11 to 14 have the same function as in Cr's 7 to 10, and are simultaneously released to Cb 15 during the high level of an SAZ signal. Therefore, it is possible to provide an effect of a 4-tap FIR filter. In this case, the sampling rate in dump switch 16 operated by an SAZ signal is one-fourth of the sampling rate in integration switches 18 to 25. This filter is referred to as "second FIR filter." The Z conversion of the transfer function of the second FIR filter is represented by the following equation.

[3]

$$H_{FIR2} = \frac{11-z^{-4}}{41-z^{-1}} \quad \text{(Equation 3)}$$

Also, four Cr's are connected with Cb 15 in the above group unit of four Cr's 7 to 10 or Cr's 11 to 14. By this means, it is possible to provide an effect of an IIR filter. This filter is referred to as "second IIR filter." The Z conversion of the transfer function of the second IIR filter is represented by the following equation. Here, assume that the capacity value of Cb 15 is "Cb."

[4]

$$H_{IIR2} = \frac{4Cr}{4Cr + Cb - Cbz^{-1}} \quad \text{(Equation 4)}$$

After integration signals are released from the group of Cr's 7 to 10 or from the group of Cr's 11 to 14, the D signal has the low level, dump switch 16 is turned off, and Cb 15 is separated from Cr's 7 to 10.

If the R signal is received as input in the gate of reset switch 17 and reset switch 17 is turned on when the SBZ signal has the high level and the SAZ signal has the low level, signals held in four Cr's 7 to 10 are released to the ground terminal side of Cr's 7 to 10 and reset. Afterward, when the FB 0 signal is received as input in the gate of feedback switch 34 and feedback switch 34 is turned on, a feedback signal is received as input from a signal processing section to the side of sampling mixer 101 via a DA converter (not shown). The feedback signal is the signal for compensating, for example, a DC offset and differential offset, and is generated in the signal processing section (not shown). To be more specific, the signal processing section receives as input an output signal of sampling mixer 101 via the AD converter. Further, the signal processing section generates the above feedback signal based on the output signal. By this means, the DC offset and differential offset are compensated. That is, by the feedback signal at this time, upon the operations of the first IIR filter, the DC offset and differential offset are compensated.

By contrast, if the R signal is received as input in the gate of reset switch 17 when the SAZ signal has the high level and the SBZ signal has the low level, reset switch 17 is turned on, and signals held in four Cr's 11 to 14 are released to the ground terminal side of Cr's 11 to 14 and reset. Afterward, when the FB 1 signal is received as input in the gate of switch 35 and feedback switch 35 is turned on, a feedback signal is received as input from a signal processing section to the side of sampling mixer 101 via a DA converter (not shown).

If in-phase sampling mixer 101 is configured as above, an output signal of that sampling mixer 101 is a signal having passed the first FIR filter, first IIR filter, second FIR filter and second IIR filter.

If the overall filter transfer function of sampling mixer 101 is arranged using equations 1, 2, 3 and 4 and the equation of current conversion by TA 1, the function is represented by the following equation Here, assume that the transconductance of TA 1 is "gm" and the frequency of an input RE signal is "$f_{RF}$."

[5]

(Equation 5)
$$H = \frac{gm}{\pi f_{RF}} H_{FIR1} H_{IIR1} H_{FIR2} H_{IIR2}$$
$$= \frac{gm}{\pi f_{RF}} \frac{1-z^{-8}}{1-z^{-1}} \frac{1}{(C_H + C_R) - C_H z^{-8}} \frac{1}{4} \frac{1-z^{-32}}{1-z^{-8}} \frac{4C_g}{(4C_g + C_g) - C_g z^{-32}}$$

FIG. 8 shows filter characteristics corresponding to above equations 1 to 5. FIG. 8A shows the filter characteristic of the first FIR filter corresponding to equation 1, and FIG. 8B shows the filter characteristic of the first IIR filter corresponding to equation 2. Also, FIG. 8C shows the filter characteristic of the second FIR filter corresponding to equation 3, and FIG. 8D shows the characteristic of the second IIR filter corresponding to equation 4. Further, FIG. 8E shows the overall filter characteristic of in-phase sampling mixer 101 corresponding to equation 5. Here, assume that the LO signal frequency is 2.4 GHz, the capacity of Ch 6 is 15 pF, the capacity of Cr's 7 to 14 is 0.5 pF, the capacity of Cb 15 is 15 pF and the transconductance of TA 1 is 7.5 mS.

In the filter characteristic examples shown in FIG. 8, the sampling frequency provided in Cb 15 is 75 MHz. This is because the parallel configuration parts comprised of the group of Cr's 7 to 10 and the group of Cr's 11 to 14, both operate at 37.5 MHz and release signals alternately.

Thus, alias components occur at frequency intervals matching the operation frequencies of the groups provided in parallel (in this case, at 37.5 MHz intervals) or at frequency intervals matching the overall output frequency of Cr's 7 to 14 which is equivalent to the sum of both operation frequencies (in this case, at 75 MHz intervals). As described above, these alias components are a factor of the degradation of reception sensitivity.

Here, there is a phase difference in which the alias component level becomes much lower when the phase difference between an LO signal and control signal is changed (hereinafter referred to as "unique phase difference"). This unique phase difference adopts a value in accordance with the LO signal frequency, the RF signal frequency and the output signal frequency of quadrature demodulator 100.

Figure 9:
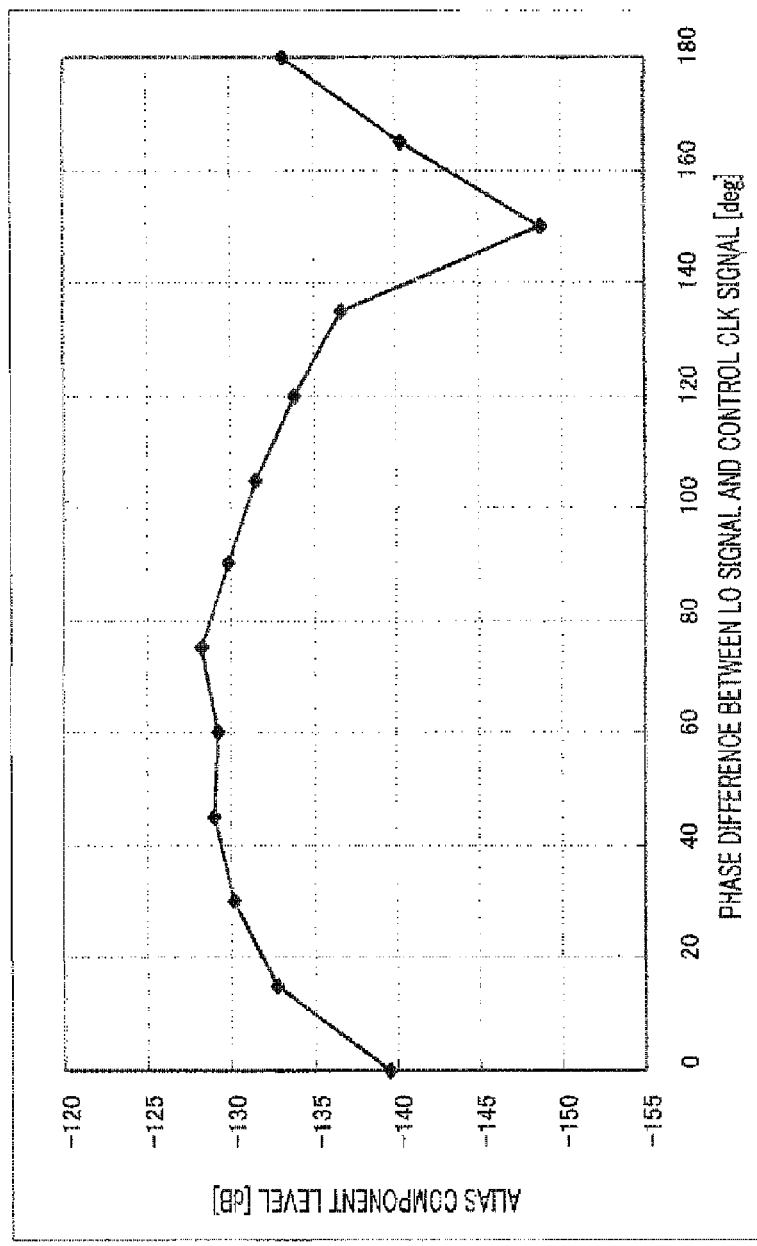
FIG. 9 shows the level of alias component with respect to the phase difference between an LO signal and a control signal.

FIG. 9 shows the level of alias components with respect to the phase difference between an LO signal and control signal. In FIG. 9, the phase difference between the LO signal and control signal is represented by a phase based on the LO signal frequency. Here, conditions are set where the LO signal frequency is 2.4 GHz, the RF signal frequency is 2.438 GHz and the output signal frequency is 500 KHz.

As seen from FIG. 9, under the above conditions, the unique phase difference is about 150 degrees. Therefore, in-phase sampling mixer 101 and quadrature-phase sampling mixer 102 adjust the phase difference between an LO signal and control signal to 150 degrees, so that it is possible to prevent the degradation of reception sensitivity under the above conditions.

As described above, according to the present embodiment, in quadrature demodulator 100, a signal processing section (not shown) holds an association table associating combinations of the LO signal frequency, the RF signal frequency and the output signal frequency of quadrature demodulator 100 (i.e. the setting states of quadrature demodulator 100) with "unique phase differences" based on the combinations. Further, the signal processing section outputs a delay control signal such that the phase difference between an LO signal and control signal matches the unique phase difference associated with the setting state of quadrature demodulator 100. By this means, quadrature demodulator 100 can prevent the degradation of reception sensitivity, regardless of setting states.

Also, the LO signal frequency and the output signal frequency of quadrature demodulator 100 are normally fixed, and, in this case, the unique phase difference varies depending on the RF signal frequency (i.e. desired wave frequency). Therefore, the signal processing section needs to hold an association table associating in advance the RF signal frequency and unique phase differences based on the RF signal frequency, and, using this association table, output a delay control signal in accordance with the unique phase difference associated with the desired wave frequency. For example, when quadrature demodulator 100 is used in a television broadcasting receiver, it is necessary to hold an association table memorizing the unique phase differences of television channels of different RF signal frequencies, and adjust the phase difference between an LO signal and control signal to the unique phase difference associated with a television channel selected in a channel selecting section provided in the receiver.

Also, quadrature demodulator 100 according to the present embodiment adjusts the amount of delay to give to input signals in delay control section 117 of in-phase sampling mixer 101, so that it is possible to adjust the phase of an output control signal. Also, delay control section 120 (or delay control section 121) gives a delay based on a delay control signal to an LO signal (I) (or LOB signal (I)), so that it is possible to adjust the phase of the LO signal (or LOB signal (I)).

That is, in-phase sampling mixer 101 adjusts both the phase of an output control signal of control signal generating section 115 and the phase of an output LO signal (or output LOB signal) of LO signal generating section 104, thereby adjusting the relative phase relationship between the output control signal and the output LO signal (or output LOB signal).

However, the present invention is not limited to this, and it is equally possible to adjust the phase of an output control signal of control signal generating section 115 or the phase of an output LO signal (or output LOB signal) of LO signal generating section 104. An essential requirement is to be able to adjust at least one of the phase of the output control signal of control signal generating section 115 and the phase of the output LO signal (or output LOB signal) of LO signal generating section 104.

Also, although a case has been described above with the present embodiment where, in LO signal generating section 104, the output signal frequency of local oscillator 103 is double the LO signal frequency, the number of frequency divisions in frequency divider 118 is 2 and the number of frequency divisions in frequency divider 119 is 4, the present invention is not limited to this.

Also, although frequency dividers are used to generate LO signals and REF signals with a 90-degree phase difference in the present embodiment, the present invention is not limited to this, and it is equally possible to use a polyphase filter, and so on.

(Embodiment 2)

A case will be explained with Embodiment 2 of the present invention where the number of times decimation is performed in a sampling mixer is small (especially, the number of times decimation is performed is zero). A sampling mixer configured with a small number of decimations (or configured without decimation), is especially suitable for the use in, for example, radio systems such as UHF-band terrestrial digital television broadcast with a wide reception band.

Figure 10:
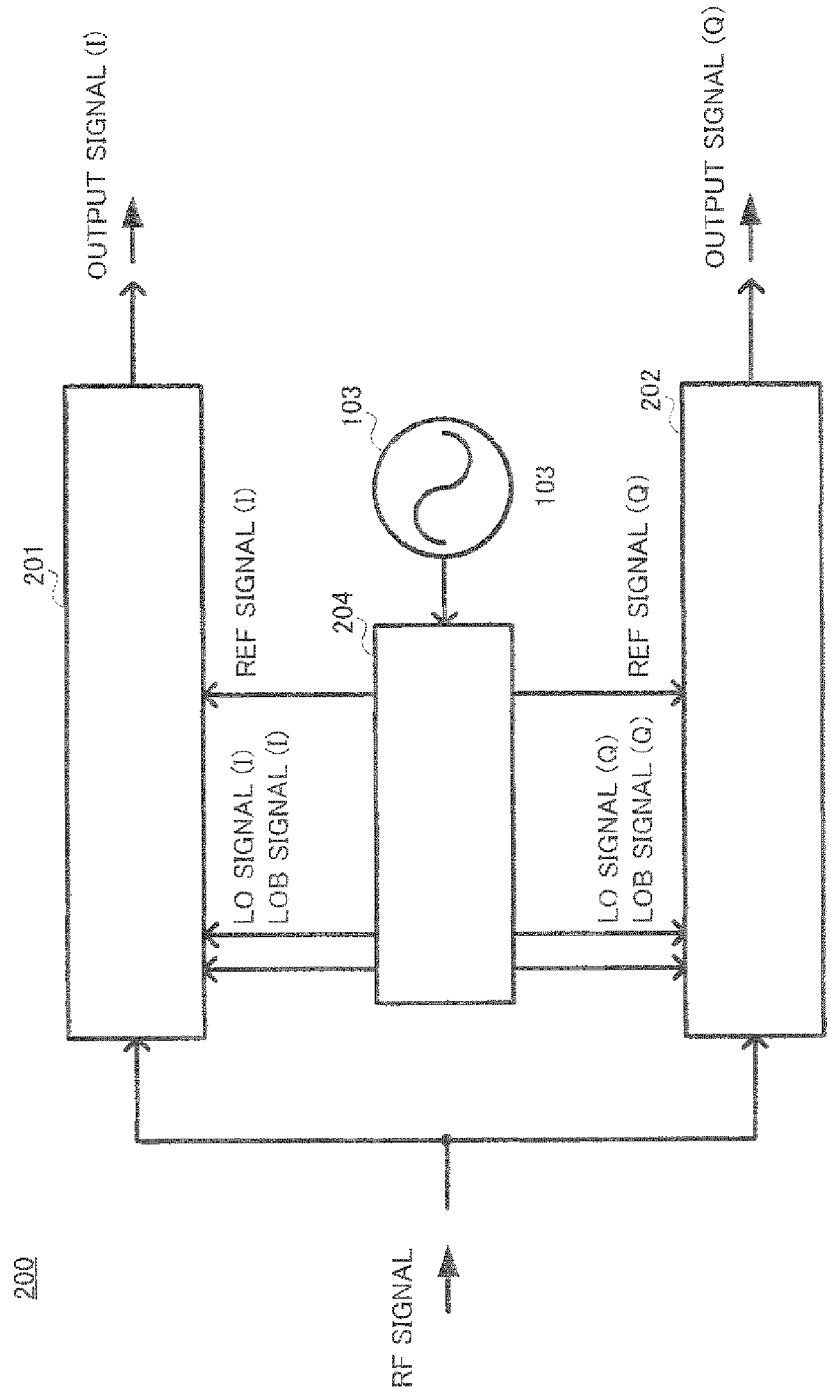
FIG. 10 is a block diagram showing a quadrature demodulator according to Embodiment 2 of the present invention.

FIG. 10 is a block diagram showing quadrature demodulator 200 according to Embodiment 2 of the present invention. Different points from Embodiment 1 will be mainly explained below.

Quadrature demodulator 200 is provided with in-phase sampling mixer 201, quadrature-phase sampling mixer 202 and LO signal generating section 204.

LO signal generating section 204 adjusts the timing of LO signals and LOB signals, which are acquired by dividing the frequency of signals outputted from local oscillator 103 by 2, adjusts the timing of REF signals and then outputs the signals to in-phase sampling mixer 201 and quadrature-phase sampling mixer 202.

Figure 11:
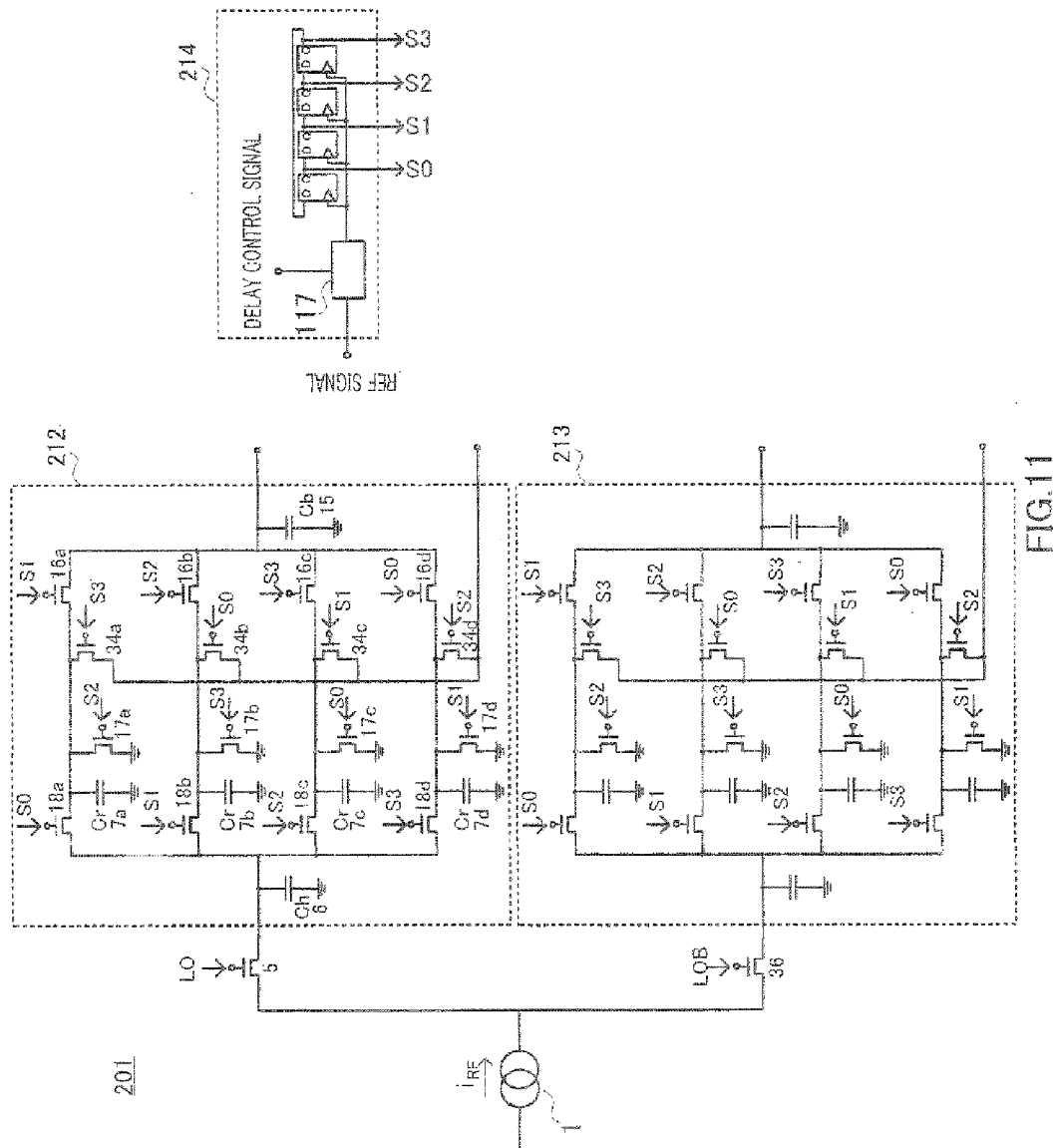
FIG. 11 shows a circuit configuration of an in-phase sampling mixer.

FIG. 11 shows a circuit configuration of in-phase sampling mixer 201. Here, quadrature-phase sampling mixer 202 has the same circuit configuration as in in-phase sampling mixer 201, and therefore its explanation will be omitted. Here, the phases of input LO signals and REF signals vary between in-phase sampling mixer 201 and quadrature-phase sampling mixer 202.

In FIG. 11, in-phase sampling mixer 201 is provided with TA 1, switched capacitor sections 212 and 213, control signal generating section 214 and sampling switches 5 and 36.

Switched capacitor section 212 is formed with Ch (which stands for "history capacitor") 6, Cr's (which stand for "rotating capacitors") 7a, 7b, 7c and 7d, Cb (which stands for "buffer capacitor") 15, dump switches 16a, 16b, 16c and 16d, reset switches 17a, 17b, 17c and 17d, integration switches 18a, 18b, 18c and 18d and feedback switches 34a, 34b, 34c and 34d.

Switched capacitor section 213 has a similar configuration to switched capacitor section 212. Here, an LOB that is received as input in sampling switch 36 of switched capacitor section 213 is delayed by half the frequency behind an LO that is received as input in sampling switch 5 of switched capacitor section 212. Therefore, there is a difference of half the period between the sampling timing in in-phase mixer section 2 and the sampling timing in reverse-phase mixer section 3.

Control signal generating section 214 generates various control signals based on an REF signal received from LO signal generating section 204, and outputs the generated various control signals. Further, control signal generating section 214 adjusts the output timings of these various control signals, based on the first delay control signal received from a signal processing section (not shown).

Control signal generating section 214 is formed with shift registers using D flip-flops and delay control section 117. The shift registers output control signals of four phases (i.e. S0 signal, S1 signal, S2 signal and S3 signal) with reference to an REF signal. Periods in which the high level and the low level are repeated are common between the S0 signal, S1 signal, S2 signal and S3 signal, and the phase varies by one-fourth frequency between these signals. In the S0 signal, S1 signal, S2 signal and S3 signal, the duration of the high level matches one LO signal period.

Delay control section 117 is the same as in Embodiment 1. Therefore, control signal generating section 214 adjusts the phase of an output control signal by adjusting the amount of delay to give to input signals in delay control section 117.

Figure 12:
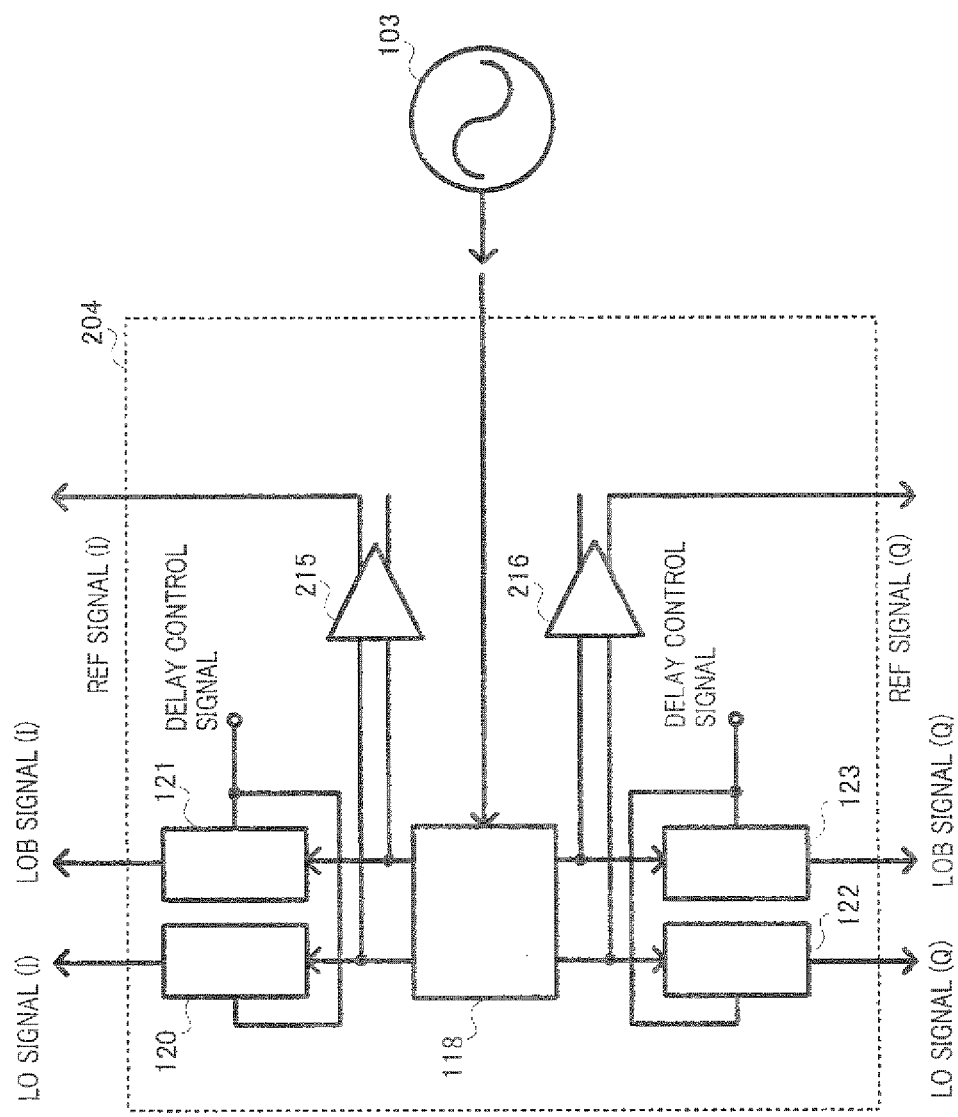
FIG. 12 is a block diagram showing the configuration of an LO signal generating section.

FIG. 12 is a block diagram showing the configuration of LO signal generating section 204.

In FIG. 12, LO signal generating section 204 is provided with buffer amplifiers 215 and 216 that buffer the outputs of frequency divider 118.

Buffer amplifier 215 buffers an LO signal (I) and LOB signal (I), and outputs one of these signals as a REF signal (I). Here, although the output signal of buffer amplifier 215 in response to an input of the LO signal (I) is the REF signal (I), the output signal of buffer amplifier 215 in response to the LOB signal (I) can be the REF signal (I).

Buffer amplifier 216 has the same configuration as buffer amplifier 215.

Delay control sections 120 to 123 are the same as in Embodiment 1. Therefore, similar to LO signal generating section 104 in Embodiment 1, LO signal generating section 204 gives a delay to an LO signal (I), LOB signal (I), LO signal (Q) and LOB signal (Q) according to a delay control signal received from a signal processing section (not shown), thereby adjusting the sampling timings of received radio signals.

Similar to Embodiment 1, a signal processing section (not shown) according to the present embodiment, which outputs a delay control signal to delay control section 117 and delay control sections 120 to 123, holds a association table (i.e. the first association table) associating combinations of the LO signal frequency, the RF signal frequency and the output signal frequency of quadrature demodulator 200 (i.e. the setting states of quadrature demodulator 200) with unique phase differences relating to alias components based on the combinations.

Further, the signal processing section (not shown) according to the present embodiment holds an association table (i.e. the second association table) associating the setting states of quadrature demodulator 200 with unique phase differences relating to second-order distortion components based on the setting states.

The signal processing section (not shown) chooses one of the first association table and the second association table, as a target table for use. Further, the signal processing section (not shown) specifies a unique phase difference associated with the setting state of quadrature demodulator 200, using the target table, and outputs delay control signals to delay control section 117 and delay control section 120 such that the phase difference between an LO signal (I) and a control signal outputted from control signal generating section 115 matches the specified phase difference.

The operations of quadrature demodulator 200 having the above configuration will be explained. As described above, in-phase sampling mixer 201 and quadrature-phase sampling mixer 202 have the same configuration and share common characteristics. Further, in in-phase sampling mixer 201, switched capacitor section 212 and switched capacitor section 213 have the same configuration. Therefore, the operations of switched capacitor section 212 will be mainly explained below.

First, in the first step, when the S0 signal has the high level, Ch 6 and Cr 7a are connected, and a discrete signal outputted from sampling switch 5 is integrated in Ch 6 and Cr 7a.

Next, in the second step, when the S0 signal has the low level and the S1 signal has the high level, Cr 7a and Cb 15 are connected and the signal integrated in Cr 7a is released to Cb 15.

In the third step, when the S1 signal has the low level and the S2 signal has the high level, the remaining electrical charge in Cr 7a is grounded via reset switch 17a and reset.

In the fourth step, when the S2 signal has the low level and the S3 signal has the high level, feedback switch 34a is turned on and a feedback signal from a DA converter is received as input in Cr 7a, thereby compensating for the DC offset and differential offset.

Cr 7a repeats these four-step operations.

Similarly, Cr's 7b, 7c and 7d repeat the four-step operations.

At the same timing, operations of different steps are performed between the repeated operations in Cr's 7a to 7d. A switched capacitor circuit providing Cr's 7a to 7d in parallel performs four-step operations with four phases, thereby realizing processing without decimation as a whole.

Here, the operation frequency of Cr's 7a to 7d is one-fourth of the LO signal frequency, and, consequently, alias components occur in the filter characteristic of switched capacitor section 212 at frequency intervals one-fourth of the LO signal frequency.

Even in this case, if the phase difference between an LO signal and control signal is changed, a unique phase difference occurs. This unique phase difference adopts a value in accordance with the LO signal frequency, the RF signal frequency and the output signal frequency of quadrature demodulator 200.

Figure 13B:
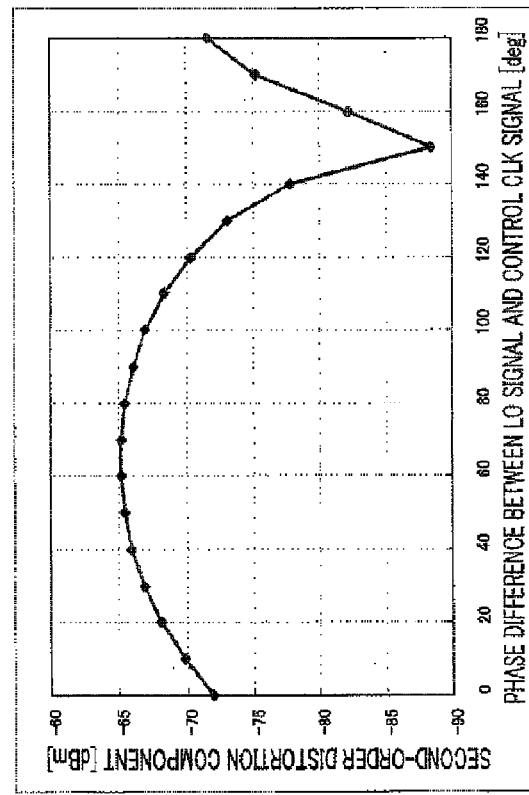
FIG. 13 shows the level of reception sensitivity characteristic degradation factor with respect to the phase difference between an LO signal and a control signal.
Figure 13A:
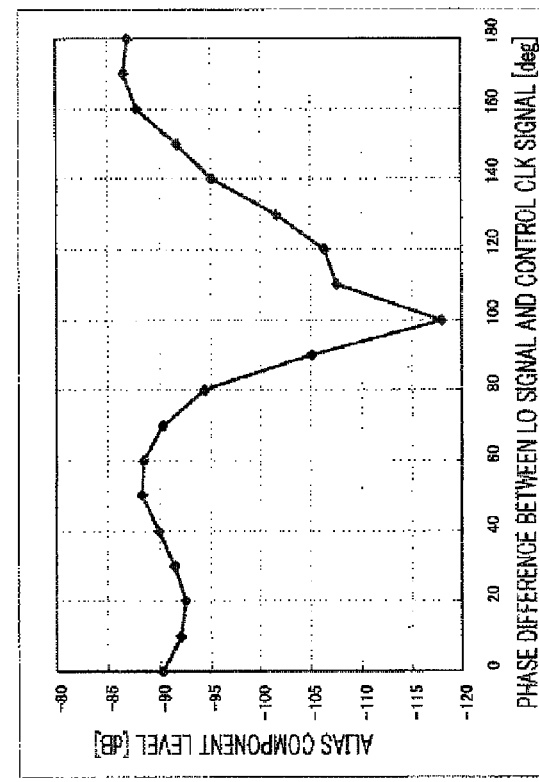

FIG. 13 shows the level of reception sensitivity characteristic degradation factor with respect to the phase difference between an LO signal and control signal. Especially, FIG. 13A shows the level of alias components with respect to the phase difference between an LO signal and control signal. In FIG. 13A, the phase difference between an LO signal and control signal is represented by a phase based on the LO signal frequency. Here, conditions are set where the LO signal frequency is 480 MHz, the RF signal frequency is 600.5 MHz and the output signal frequency is 500 KHz.

As seen from FIG. 13A, under the above conditions, the unique phase difference is about 100 degrees. Therefore, in-phase sampling mixer 201 and quadrature-phase sampling mixer 202 adjust the phase difference between an LO signal and control signal to 100 degrees, so that it is possible to suppress alias components under the above conditions and, as a result, prevent the degradation of reception sensitivity.

FIG. 13B shows the level of second-order distortion components with respect to the phase difference between an LO signal and control signal. Even in FIG. 13B, the phase difference between an LO signal and control signal is represented by a phase based on the LO signal frequency. Here, conditions are set where the LO signal frequency is 480 MHz, the RF signal frequency is 483.5 MHz and the output signal frequency is 500 KHz.

As seen from FIG. 13B, under the above conditions, the unique phase difference is about 150 degrees. Therefore, in-phase sampling mixer 201 and quadrature-phase sampling mixer 202 adjust the phase difference between an LO signal and control signal to 150 degrees, so that it is possible to suppress second-order distortion components under the above conditions and, as a result, prevent the degradation of reception sensitivity.

Also, the LO signal frequency and the output signal frequency of quadrature demodulator 200 are normally semi-fixed, and, in this case, a unique phase difference varies depending on the RF signal frequency (i.e. desired wave frequency). Therefore, a signal processing section (not shown) needs to hold the above first and second association tables between the RF signal frequency and unique phase differences based on the RF signal frequency, and, using these association tables, output a delay control signal in accordance with the unique phase difference associated with the desired wave frequency. For example, when quadrature demodulator 200 is used in, for example, a television broadcasting receiver, it is necessary to hold an association table memorizing unique phase differences of television channels of different RF signal frequencies, and adjust the phase difference between an LO signal and control signal to the unique phase difference associated with a television channel selected in a channel selecting section provided in the receiver.

As described above, according to the present embodiment, in quadrature demodulator 200, a signal processing section (not shown) holds the above first and second association tables in advance. Further, the signal processing section (not shown) chooses one of the first and second association tables as a target table for use, and, using this target table, outputs delay control signals such that the phase difference between an LO signal and control signal matches the unique phase difference associated with the setting state of quadrature demodulator 200. By this means, quadrature demodulator 200 can prevent the degradation of reception sensitivity due to alias components or second-order distortion components, regardless of setting states.

Also, cases have been described above with Embodiments 1 and 2 where quadrature demodulator 100 and quadrature demodulator 200 have a single-balanced configuration. A single-balanced configuration means the configuration in which Ta 1 receives as input only an in-phase signal and sampling switches 5 and 36 perform sampling at half the period different from each other. However, quadrature demodulator 100 and quadrature demodulator 200 are not limited to a single-balanced configuration, and can employ a double-balanced configuration. If this double-balanced configuration is employed, it is possible to provide the same advantage as in Embodiments 1 and 2. The double-balanced configuration uses TA with a differential configuration having an in-phase signal input terminal and reverse-phase input terminal, provides sampling switches in the in-phase signal input terminal and reverse-phase input terminal of TA, so that these two sampling switches perform sampling at half the period different from each other.

(Embodiment 3)

In Embodiment 3, a specific application example of quadrature demodulators 100 and 200 according to Embodiments 1 and 2 will be explained.

Figure 14:
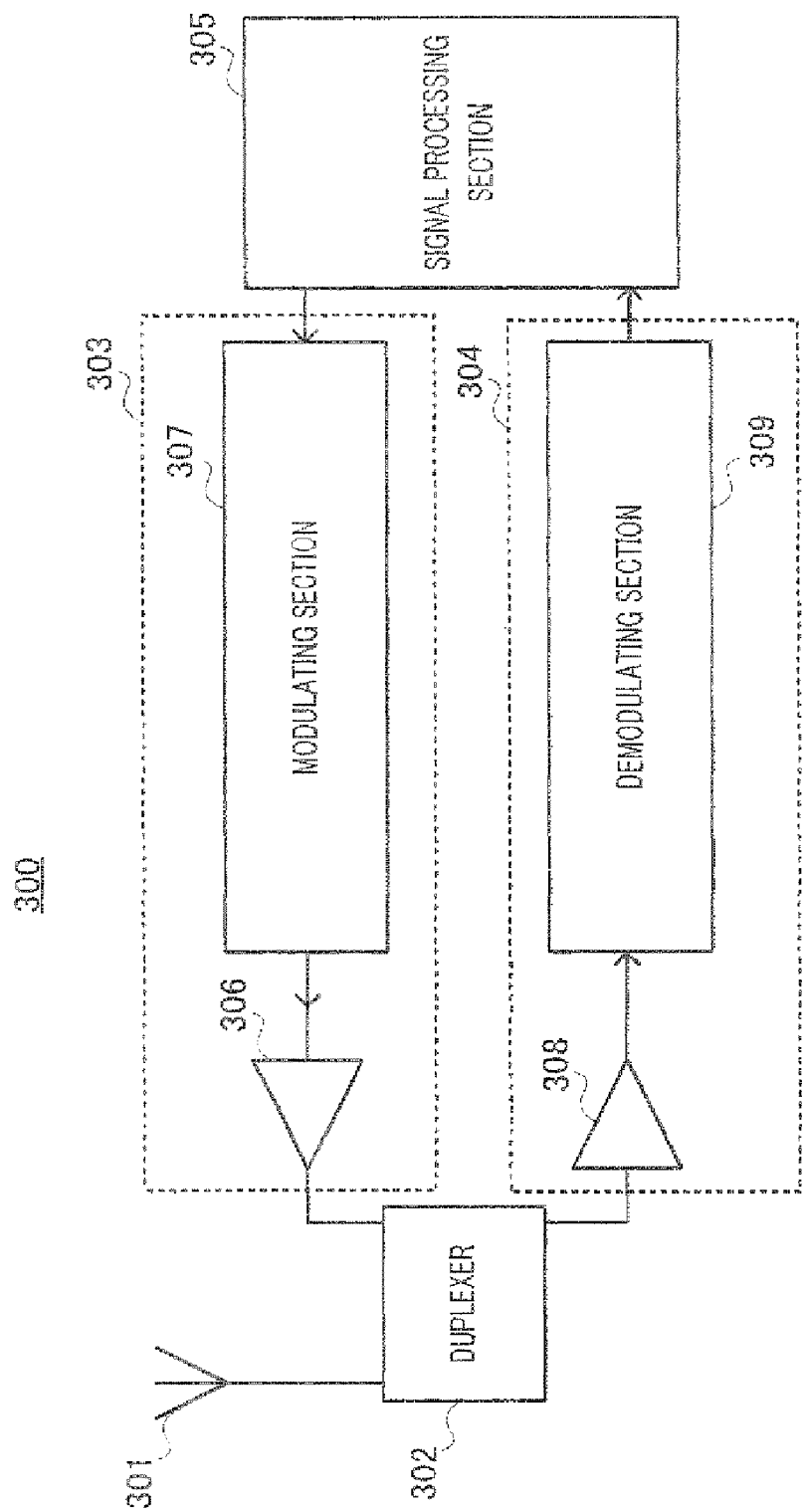
FIG. 14 is a block diagram showing the configuration of a radio apparatus according to Embodiment 3 of the present invention.

FIG. 14 is a block diagram showing the configuration of radio apparatus 300 according to Embodiment 3 of the present invention. Radio apparatus 300 represents, for example, a mobile telephone, car-phone or transceiver.

In FIG. 14, radio apparatus 300 is provided with antenna 301, duplexer 302, transmitting section 303, receiving section 304 and signal processing section (DSP) 305. Transmitting section 303 has power amplifier (PA) 306 and modulating section 307. Receiving section 304 has low noise amplifier (LNA) 308 and demodulating section 309.

Antenna 301 is connected with transmitting section 303 and receiving section 304 via duplexer 302. Upon receiving as input a signal from transmitting section 303, of the signal, duplexer 302 passes and outputs a signal of the frequency band for transmission signals to antenna 301. By contrast, upon receiving as input a signal from antenna 301, of the signal, duplexer 302 passes and outputs a signal of the frequency band for received signals to receiving section 304.

In signal processing section 305, after the output signal from receiving section 304 is subjected to AD conversion, the resulting signal is subjected to signal processing (such as speech processing and data processing). Further, in signal processing section 305, after a predetermined input signal (such as speech and data) is subjected to signal processing, the resulting signal is subjected to DA conversion and outputted to transmitting section 303. Here, in FIG. 14, although one signal processing section 305 is provided in radio apparatus 300, it is equally possible to provide a plurality of signal processing sections 305.

Quadrature demodulator 100 according to Embodiment 1 can be used as demodulating section 309. By this means, it is possible to adjust the phase relationship between an LO signal and control signal, so that it is possible to suppress the degradation of reception sensitivity by suppressing alias components.

Also, quadrature demodulator 200 according to Embodiment 2 can be used as demodulating section 309. By this means, it is possible to suppress second-order distortion components in addition to alias components, so that it is possible to suppress the overall degradation of radio apparatus 300.

(Embodiment 4)

Even in Embodiment 4, a specific application example of quadrature demodulators 100 and 200 according to Embodiments 1 and 2 will be explained.

Figure 15:
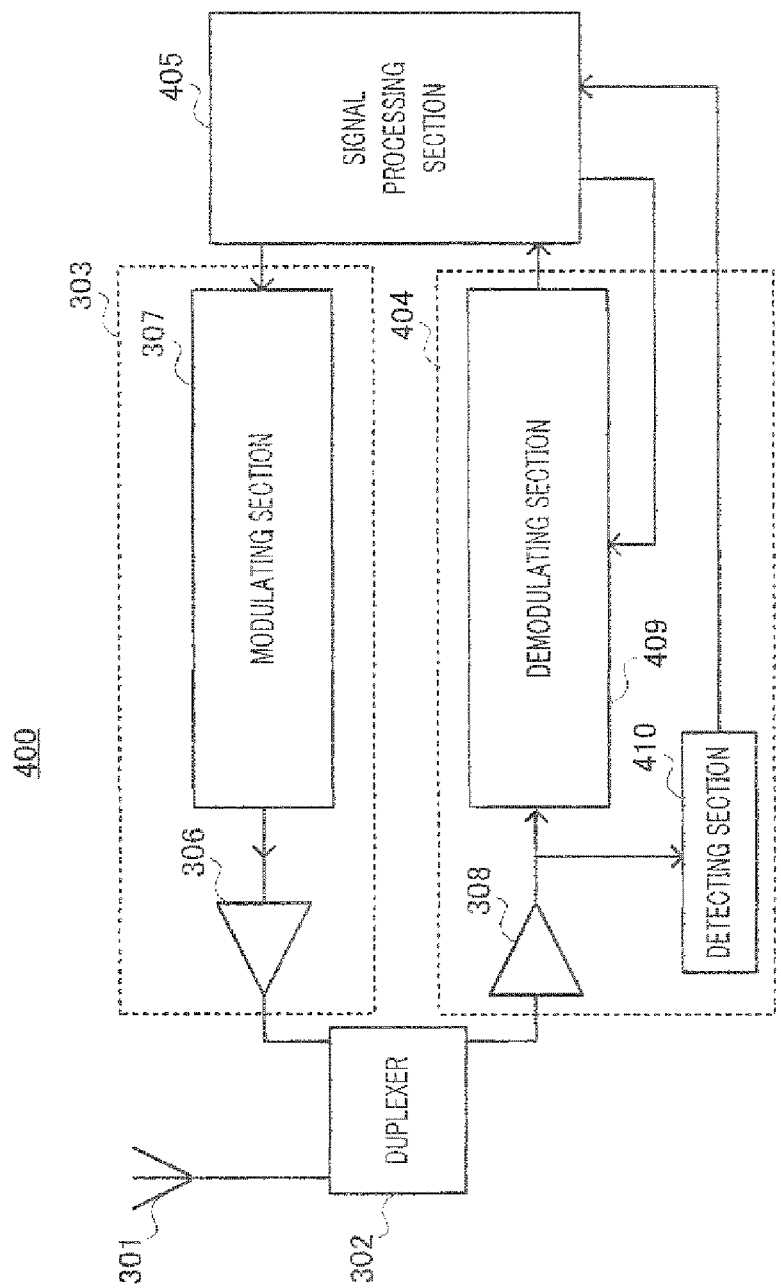
FIG. 15 is a block diagram showing the configuration of a radio apparatus according to Embodiment 4 of the present invention.

FIG. 15 is a block diagram showing the configuration of radio apparatus 400 according to Embodiment 4 of the present invention. Here, different components from radio apparatus 300 according to Embodiment 3 will be explained.

In FIG. 15, receiving section 404 has detecting section 410.

Detecting section 410 monitors an output signal of LNA 308 and outputs the monitoring result (such as output power, frequency and peak to average power ratio) to signal processing section (DSP) 405.

DSP 405 outputs a delay control signal to demodulating section 409 based on the monitoring result. That is, in this case, DSP 405 is substituted for a signal processing section (not shown) explained in Embodiments 1 and 2.

Quadrature demodulator 100 according to Embodiment 1 can be used as demodulating section 409. By this means, it is possible to adjust the phase relationship between an LO signal and control signal, so that it is possible to suppress the degradation of reception sensitivity by suppressing alias components.

Also, quadrature demodulator 200 according to Embodiment 2 can be used as demodulating section 409. If detecting section 410 monitors the frequency components of a signal outputted from LNA 308, DSP 405 can define the following criteria for choosing a target table for use from the above first and second association tables held in advance.

That is, if there is a component of n-fourth (where n is an integer) of the LO frequency in the monitoring result, the above first association table is chosen to suppress alias components. By contrast, if there is no component of n-fourth of the LO frequency in the monitoring result, the above second association table is chosen to suppress second-order distortion.

DSP 405 outputs a delay control signal using the target table chosen as above, so that it is possible to suppress alias components or second-order distortion components, and suppress the overall degradation of reception sensitivity in radio apparatus 400.

Here, the above criteria for choosing a target table for use can be equally used in a signal processing section (not shown) in Embodiment 2.

Although example cases have been described with the above embodiments where the present invention is implemented with hardware, the present invention can be implemented with software.

Furthermore, each function block employed in the description of each of the aforementioned embodiments may typically be implemented as an LSI constituted by an integrated circuit. These may be individual chips or partially or totally contained on a single chip. "LSI" is adopted here but this may also be referred to as "IC," "system LSI," "super LSI," or "ultra LSI" depending on differing extents of integration.

Further, the method of circuit integration is not limited to LSI's, and implementation using dedicated circuitry or general purpose processors is also possible. After LSI manufacture, utilization of an FPGA (Field Programmable Gate Array) or a reconfigurable processor where connections and settings of circuit cells in an LSI can be reconfigured is also possible.

Further, if integrated circuit technology comes out to replace LSI's as a result of the advancement of semiconductor technology or a derivative other technology, it is naturally also possible to carry out function block integration using this technology. Application of biotechnology is also possible.

The disclosure of Japanese Patent Application No. 2007-320380, filed on Dec. 12, 2007, including the specification, drawings and abstract, is incorporated herein by reference in its entirety.

Industrial Applicability

The sampling mixer, quadrature demodulator and radio apparatus of the present invention are effective for suppressing the degradation of reception sensitivity due to alias components or second-order distortion components.

The invention claimed is:

1. A sampling mixer comprising:
a sampling switch that samples a received signal based on a local signal of a predetermined frequency;
a control signal generating section that generates a control signal for controlling a filter operation;
a switched capacitor section that performs filter processing of a sample signal acquired in the sampling switch, based on the control signal; and
a phase difference control section that controls a phase difference between the local signal and the control signal such that the phase difference matches a unique phase difference according to a frequency of a desired reception signal, the unique phase difference representing a phase difference in which signal strength of an alias component and a second-order distortion component in the received signal are lowest.

2. The sampling mixer according to claim 1, wherein:
the control signal generating section comprises a control signal generating circuit and a delay control section as the phase control section;
the control signal generating circuit generates the control signal based on an input reference signal; and
the delay control section gives a delay to a reference signal received as input in the control signal generating circuit, according to the frequency of the desired reception signal, 3. The sampling mixer according to claim 1, further comprising a local signal generating section that generates a local signal and outputs the generated local signal to the sampling switch, wherein:
the local signal generating section comprises a delay control section as the phase control section; and
the delay control section receives as input the local signal, gives a delay to the input local signal according to the frequency of the desired reception signal, and outputs the local signal with the delay to the sampling switch.

4. A radio apparatus comprising:
the sampling mixer according to claim 1; and
a signal processing section that performs signal processing based on an output signal of the sampling mixer.

5. A sampling mixer comprising:
a sampling switch that samples a received signal bases on a local signal of a predetermined frequency;
a control signal generating section that generates a control signal for controlling a filter operation;
a switched capacitor section that performs filter processing of a sample signal acquired in the sampling switch, based on the control signal; and
a phase difference control section that controls a phase difference between the local signal and the control signal according to a frequency of a desired reception signal, wherein
the control signal generating section comprises a control signal generating circuit and a delay control section as the phase control section;
the control section gives a delay to a reference signal received as input in the control signal generating circuit, according to the frequency of the desired reception signal,
wherein the delay control section has a plurality of paths with different numbers of inverters and adjusts a delay time to give to an input signal by switching a path through which the input signal passes between the plurality of paths.

6. A sampling mixer comprising:
a sampling switch that samples a received signal based on a local signal of a predetermined frequency;
a control signal generating section that generates a control signal for controlling a filter operation;
a switched capacitor section that performs filter processing of a sample signal acquired in the sampling switch, based on the control signal; and
a phase difference control section that controls a phase difference between the local signal and the control signal according to a frequency of a desired reception signal, wherein
the control signal generating section comprises a control signal generating circuit and a delay control section as the phase control section;
the control signal generating circuit generates the control signal based on an input reference signal; and
the delay control section gives a delay to a reference signal received as input in the control signal generating circuit, according to the frequency of the desired reception signal,
wherein the delay control section has a plurality of ground capacitors with different capacity values and adjusts a delay time to give to an input signal by switching a ground capacitor connected with a path through which the input signal passes between the plurality of ground capacitors.

7. A quadrature demodulator that comprises an in-phase sampling mixer, a quadrature-phase sampling mixer and a local signal generating section, wherein the in-phase sampling mixer and the quadrature-phase sampling mixer comprise:
a sampling switch that samples a received signal based on a local signal of a predetermined frequency;
a control signal generating section that generates a control signal for controlling a filter operation;
a switched capacitor section that performs filter processing of a sample signal acquired in the sampling switch, based on the control signal; and
a phase difference control section that controls a phase difference between the local signal and the control signal such that the phase difference matches a unique phase difference according to a frequency of a desired reception signal, the unique phase difference representing a phase difference in which signal strength of an alias component and a second-order distortion component in the received signal are lowest.

8. The quadrature demodulator according to claim 7, wherein:
the control signal generating section comprises a control signal generating circuit and a delay control section as the phase control section;
the control signal generating circuit generates the control signal based on an input reference signal; and
the delay control section gives a delay to a reference signal received as input in the control signal generating circuit, according to the frequency of the desired reception signal.

9. The quadrature demodulator according to claim 7, further comprising a local signal generating section that generates a local signal and outputs the generated local signal to the sampling switch, wherein:
the local signal generating section comprises a delay control section as the phase control section; and
the delay control section receives as input the generated local signal, gives a delay to the input local signal according to the frequency of the desired reception signal, and outputs the local signal with the delay to the sampling switch.

10. A radio apparatus comprising:
the quadrature demodulator according to claim 7; and
a signal processing section that performs signal processing based on an output signal of the quadrature demodulator.

11. A quadrature demodulator that comprises an in-phase sampling mixer, a quadrature-phase sampling mixer and a local signal generating section, wherein the in-phase sampling mixer and the quadrature-phase sampling mixer comprise:
a sampling switch that samples a received signal based on a local signal of a predetermined frequency;
a control signal generating section that generates a control signal for controlling a filter operation;
a switched capacitor section that performs filter processing of a sample signal acquired in the sampling switch, based on the control signal; and
a phase difference control section that controls a phase difference between the local signal and the control signal according to a frequency of a desired reception signal, wherein
the control signal generating section comprises a control signal generating circuit and a delay control section as the phase control section;
the control signal generating circuit generates the control signal based on an input reference signal; and
the delay control section gives a delay to a reference signal received as input in the control signal generating circuit, according to the frequency of the desired reception signal,
wherein the delay control section has a plurality of paths with different numbers of inverters and adjusts a delay time to give to an input signal by switching a path through which the input signal passes between the plurality of paths.

12. A quadrature demodulator comprising an in-phase sampling mixer, a quadrature-phase sampling mixer and a local signal generating section, wherein the in-phase sampling mixer and the quadrature-phase sampling mixer comprise:
a sampling switch that samples a received signal based on a local signal of a predetermined frequency;
a control signal generating section that generates a control signal for controlling a filter operation;
a switched capacitor section that performs filter processing of a sample signal acquired in the sampling switch based on the control signal; and
a phase difference control section that controls a phase difference between the local signal and the control signal according to a frequency of a desired reception signal, wherein
the control signal generating section comprises a control signal generating circuit and a delay control section as the phase control section;
the control signal generating circuit generates the control signal based on an input reference signal; and
the delay control section gives a delay to a reference signal received as input in the control signal generating circuit, according to the frequency of the desired reception signal,
wherein the delay control section has a plurality of ground capacitors with different capacity values and adjusts a delay time to give to an input signal by switching a ground capacitor connected with a path through which the input signal passes between the plurality of ground capacitors.

13. A radio receiver comprising:
a sampling mixer comprising a sampling switch that samples a received signal based on a local signal of a predetermined frequency; a control signal generating section that generates a control signal for controlling a filter operation; a switched capacitor section that performs filter processing of a sample signal acquired in the sampling switch, based on the control signal; and a phase difference control section that controls a phase difference between the local signal and the control signal according to a frequency of a desired reception signal;
a selecting section that selects a frequency of a desired reception signal from a plurality of channel frequencies; and
a table that stores target phase differences associated with the channel frequencies,
wherein the phase difference control section of the sampling mixer adjusts a phase difference between the local signal and the control signal to a target phase difference associated with the frequency of the desired reception signal.

14. A radio receiver comprising:
a quadrature demodulator that comprises an in-phase sampling mixer a quadrature-phase sampling mixer and a local signal generating section, wherein the in-phase sampling mixer and the quadrature-phase sampling mixer comprise: a sampling switch that samples a received signal bases on a local signal of a predetermined frequency; a control signal generating section that generates a control signal for controlling a filter operation; a switched capacitor section that performs filer processing of a sample signal acquired in the sampling switch, bases on the control signal; and a phase difference control section that controls a phase difference between the local signal and the control signal according to a frequency of a desired reception signal;
a selecting section that selects the frequency of the desired reception signal from a plurality of channel frequencies; and
a table that stores target phase differences associated with the channel frequencies,
wherein the phase difference control section of the in-phase sampling mixer and the quadrature-phase sampling mixer adjusts a phase difference between the local signal and the control signal to a target phase difference associated with the frequency of the desired reception signal.

* * * * *